(12) United States Patent
Shibayama

(10) Patent No.: US 7,148,464 B2
(45) Date of Patent: Dec. 12, 2006

(54) PHOTODIODE ARRAY WITH A PLURALITY OF DEPRESSIONS

(75) Inventor: Katsumi Shibayama, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 193 days.

(21) Appl. No.: 10/637,040

(22) Filed: Aug. 8, 2003

(65) Prior Publication Data

US 2004/0104351 A1 Jun. 3, 2004

Related U.S. Application Data

(60) Provisional application No. 60/442,051, filed on Jan. 24, 2003, provisional application No. 60/430,661, filed on Dec. 4, 2002.

(30) Foreign Application Priority Data

Aug. 9, 2002 (JP) ............. P2002-233562
Jan. 23, 2003 (JP) ............. P2003-015318

(51) Int. Cl.
*H01L 31/00* (2006.01)
(52) U.S. Cl. ............. 250/214.1; 257/447; 250/370.11
(58) Field of Classification Search ............. 250/214.1, 250/370.11; 257/447, 460, 464, 466, 452, 257/459, 228
See application file for complete search history.

(56) References Cited

U.S. PATENT DOCUMENTS

| | | | |
|---|---|---|---|
| 3,748,546 A * | 7/1973 | Allison | .......... 257/435 |
| 4,021,836 A * | 5/1977 | Andrews et al. | ........... 257/447 |
| 4,814,847 A | 3/1989 | Tabatabaie | |
| 5,600,130 A * | 2/1997 | VanZeghbroeck | ........ 250/214.1 |
| 5,852,322 A | 12/1998 | Speckbacher | |
| 2002/0011640 A1 | 1/2002 | Bauer et al. | |

FOREIGN PATENT DOCUMENTS

| | | |
|---|---|---|
| DE | 41 02 285 | 8/1992 |
| EP | 0 279 492 | 8/1988 |
| EP | 0 444 370 | 9/1991 |
| EP | 0 768 720 | 4/1997 |
| JP | 56-148875 | * 11/1981 |
| JP | 04-241458 | 8/1992 |
| JP | 05-150049 | 6/1993 |
| JP | 06-045576 | 2/1994 |
| JP | 06-163968 | 6/1994 |
| JP | 07-333348 | 12/1995 |
| JP | 10-012851 | 1/1998 |
| JP | 10-223873 | 8/1998 |
| JP | 10-282243 | 10/1998 |

(Continued)

OTHER PUBLICATIONS

Brian Allen; "Application of CCDs to Digital X-Ray Mammography"; *SPIE*; (1994), vol. 2163; pp. 264-273.

(Continued)

*Primary Examiner*—Thanh X. Luu
(74) *Attorney, Agent, or Firm*—Drinker Biddle & Reath LLP

(57) ABSTRACT

In a photodiode array 1, incident-side depressions 7 formed by thinning from the incident surface side of light to be detected are arranged in an array, whereas opposite-side depressions 11 formed by thinning regions corresponding to regions formed with the incident-side depressions 7 from the side opposite from the incident surface are arranged in an array. The bottom of the opposite-side depressions 11 is formed with a pn junction 3, whereby photodiodes of pn junction type are arranged in an array.

9 Claims, 25 Drawing Sheets

FOREIGN PATENT DOCUMENTS

| | | |
|---|---|---|
| JP | 11-017589 | 1/1999 |
| JP | 2001-078099 | 3/2001 |
| JP | 2001-119010 | 4/2001 |
| JP | 2001-291892 | 10/2001 |

OTHER PUBLICATIONS

D. F. Barbe; "Time Delay and Integration Image Sensors"; *Solid State Imaging*; (1976); pp. 659-671.

Roehrig, et al.; "Real-Time Imaging Detectors for Portal Imaging"; *SPIE*; (1993); vol. 2009, pp. 144-167.

Toker et al.; "Design and Development of a Fiber Optic TDI CCD-Based Slot-Scan Digital Mammography System"; (1993); *SPIE*; vol. 2009; pp. 246-252.

Speller, et al.; "Current Status and Requirements for Position-Sensitive Detectors in Medicine"; *NIM*; (2002); vol. 477; pp. 469-474.

* cited by examiner

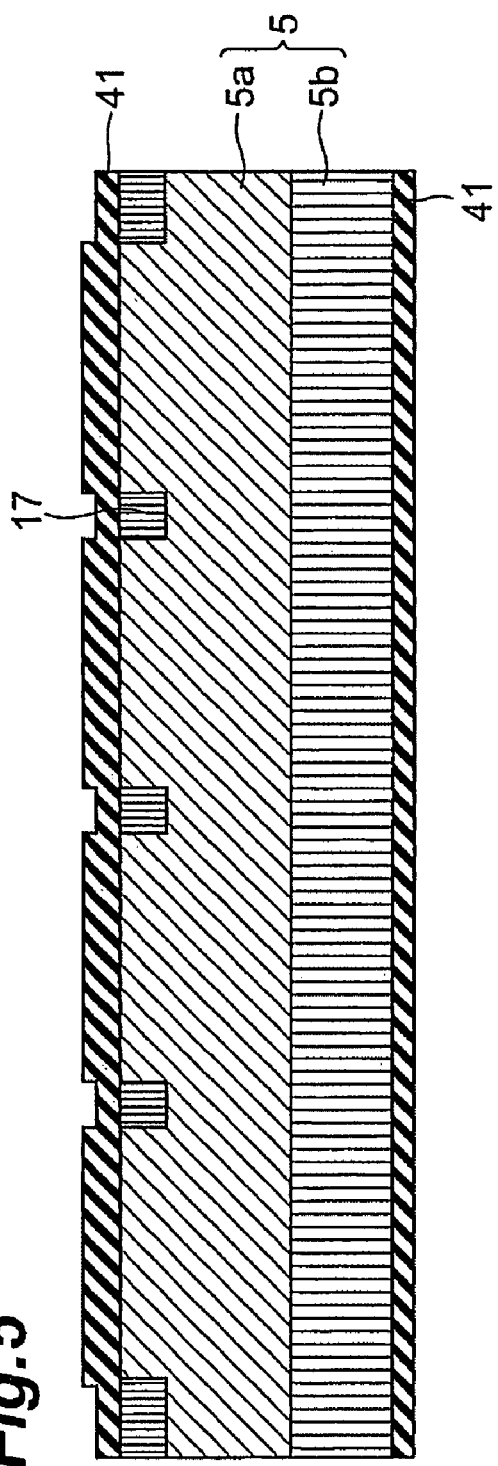
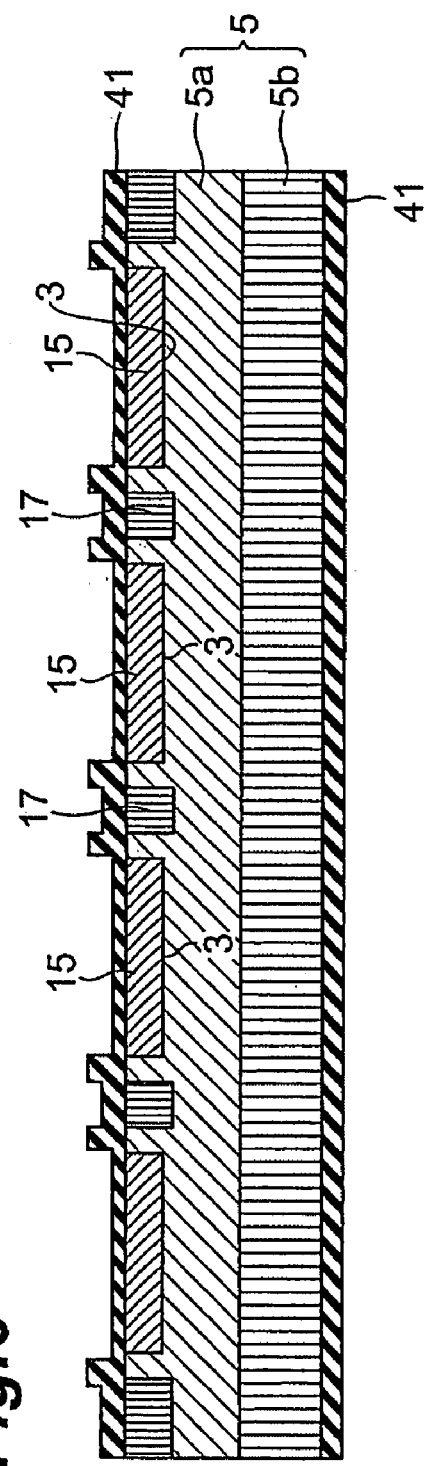

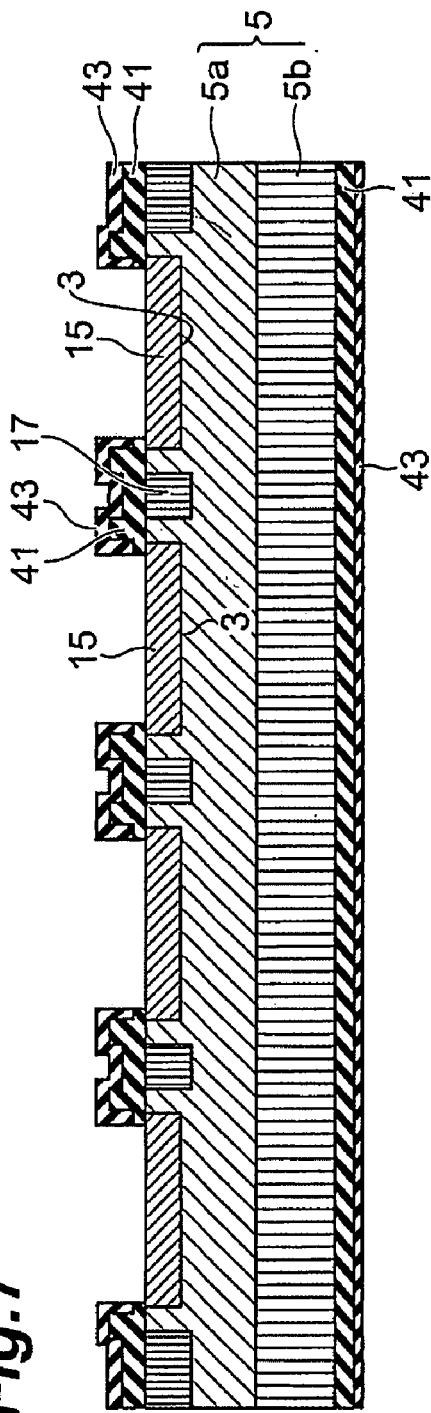
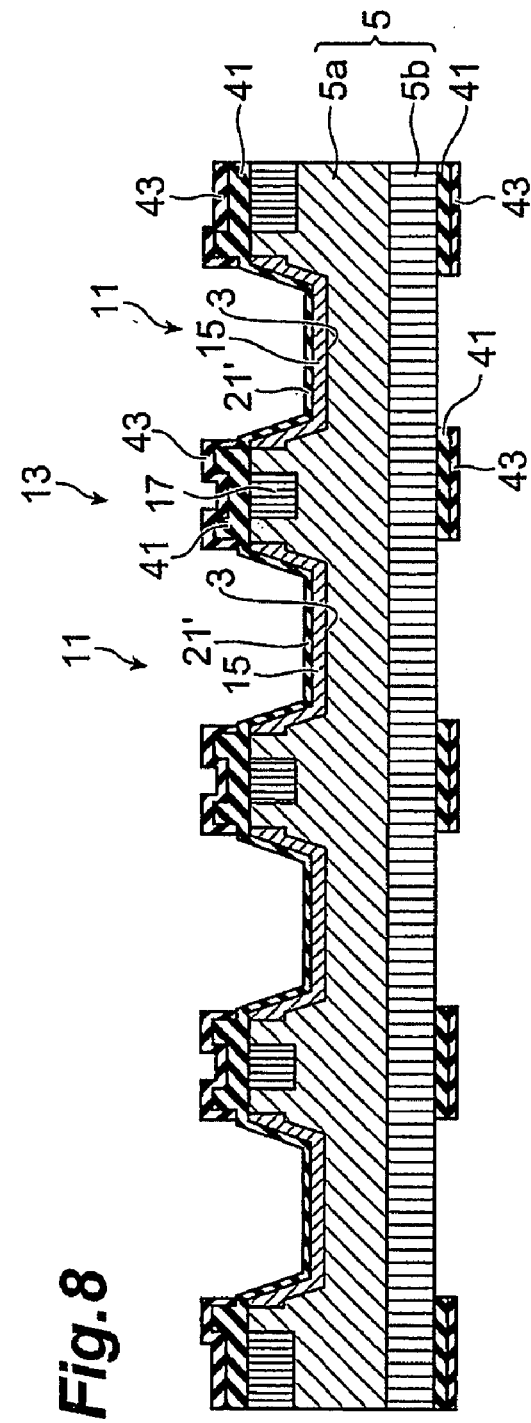

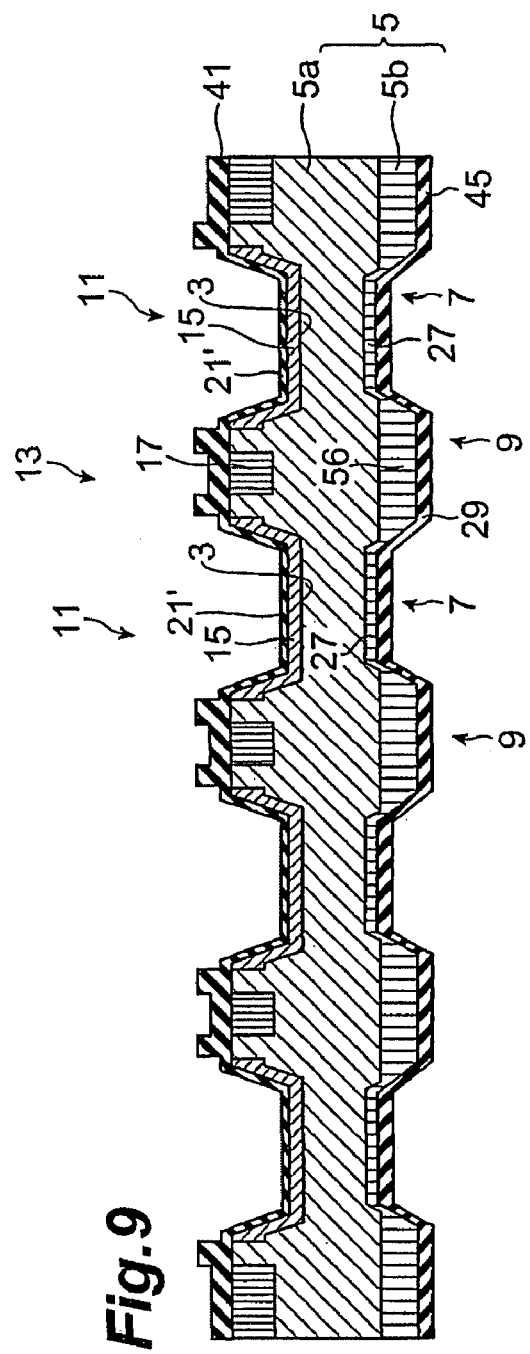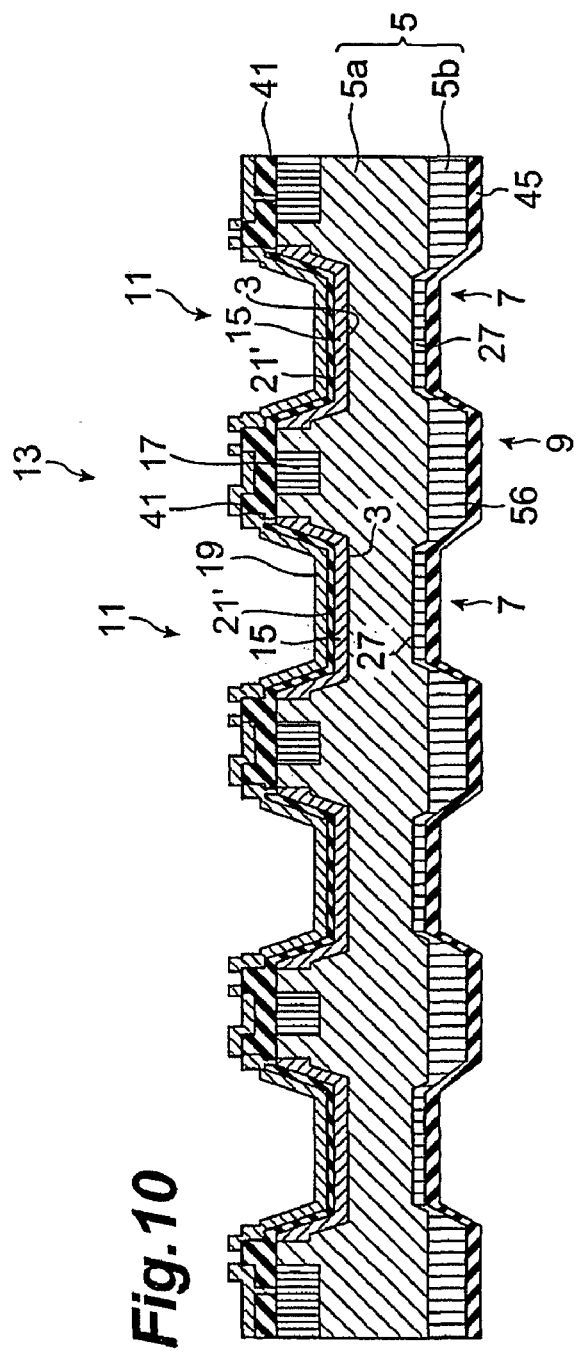

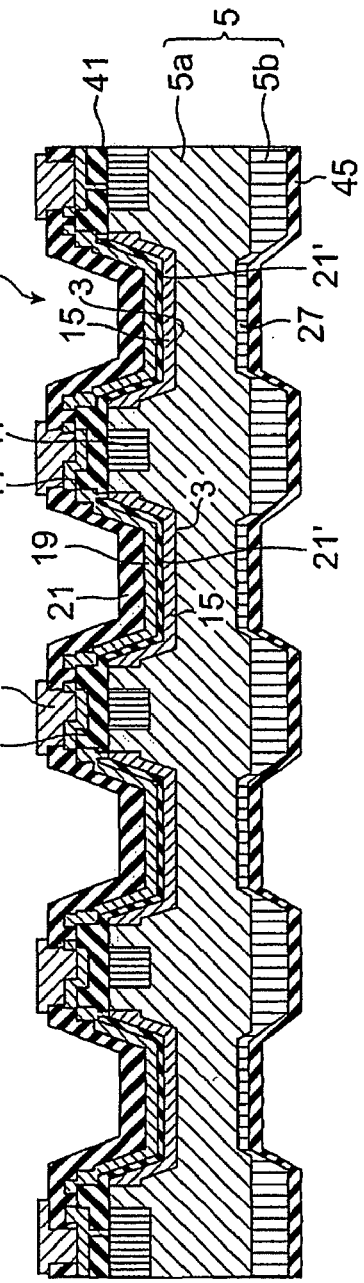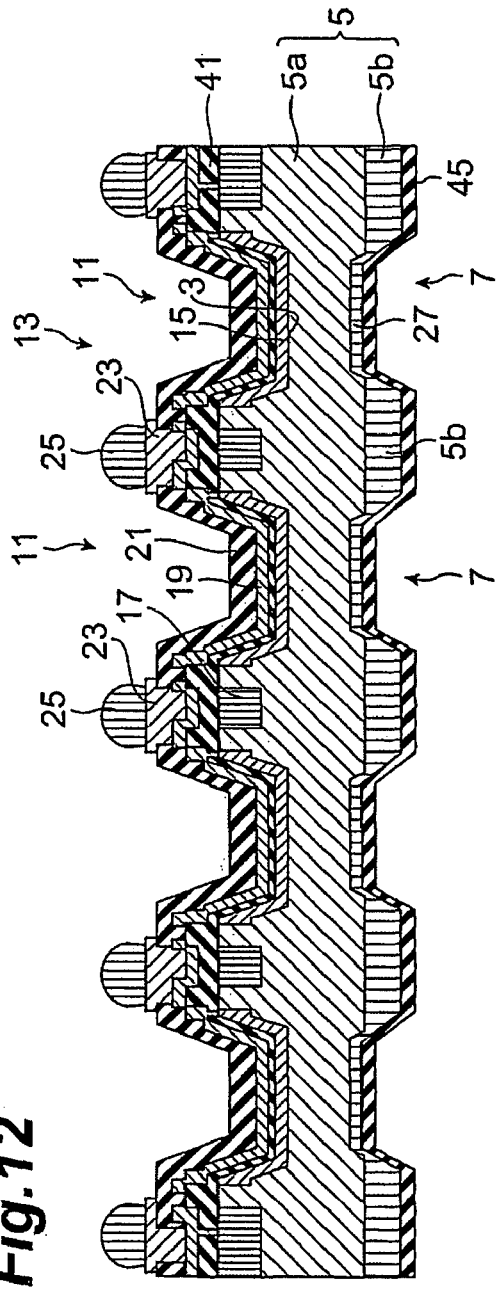

AREA S1

AREA S2 ly, and Provi-
PHOTODIODE ARRAY WITH A PLURALITY OF DEPRESSIONS

CROSS-REFERENCE TO RELATED APPLICATION

This application claims priority to Provisional Application Ser. No. 60/430,661 filed on Dec. 4, 2002 and Provisional Application Ser. No. 60/442,051 filed on Jan. 24, 2003, which are hereby incorporated by reference in their entirety.

BACKGROUND OF THE INVENTION

1. Field of the Invention

The present invention relates to a photodiode array, a method of making the same, and a radiation detector.

2. Related Background Art

Packaging a photodiode array for CT is needed to be done three-dimensionally. Three-dimensional packaging requires signals to be outputted from the opposite side from the light-incident side, for which a back-illuminated photodiode array is used in general.

When the distance between a pn junction and the light-incident surface is long in a back-illuminated photodiode array, carriers generated within a substrate are recombined in the process of migrating to the pn junction and thus cannot be taken out as a signal. As a consequence, for improving the detection sensitivity, it is necessary that the distance between the pn junction and the light-incident surface be as short as possible.

A back-illuminated photodiode array reducing this distance has been proposed (Japanese Patent Application Laid-Open No. HEI 7-333348).

FIG. 15 is a side sectional view of this photodiode array.

In this photo diode array 101, a p-type diffusion layer 105 is formed like a rectangular column extending from one side of a substrate to an n-type layer 103.

Since the p-type diffusion layer 105 is formed by injecting impurities, however, it is difficult for such an impurity layer to be formed uniformly by a thickness yielding a sufficient sensitivity.

Thus, the above-mentioned photodiode array is disadvantageous in that it is hard to manufacture.

When the photodiode array as a whole is formed thinner, its mechanical strength is hard to keep, whereby the photodiode array is likely to break in subsequent steps.

Therefore, a technique for partly thinning the photodiode array may be considered. Namely, only regions formed with photodiodes may be thinned, so as to reduce the distance between the pn junction and the light-incident surface while keeping the mechanical strength.

FIG. 16 is a side sectional view of this photodiode array.

In this photodiode array, only regions formed with a p-type diffusion layer 105 in an n-type layer 103 are thinned from the side on which light to be detected is incident, whereas the remaining regions are left with the original thickness of the semiconductor substrate as a frame, so as to maintain the mechanical strength. In this photodiode array, depressions of the n-type substrate are formed at positions corresponding to respective pn junctions from the side (backside) opposite from the front side) formed with the pn junctions. Namely, one depression is formed for each pn junction pixel. A projection is formed between a pn junction pixel and its adjacent pn junction pixel.

SUMMARY OF THE INVENTION

For using the above-mentioned photodiode array as a radiation detector, projections of the photodiode array are flip-chip bonded to a mount board while being attracted to a collet, or a scintillator is brought into contact with the projections of the photodiode array.

At that time, contact surfaces of the projections may be damaged mechanically, so that leak currents and dark currents caused by carrier generation may increase.

Since such a projection is constituted by an n-type layer, carriers are generated by light or radiation incident on the projection itself, and are made incident on some pn junction pixels, thus causing crosstalk.

Since the depressions are formed with a slope of about 55° from the backside in this photodiode array, the depressions taper down their area toward the surface formed with pn junctions, thereby reducing the area of their bottom faces.

Therefore, if a width of the frame is to be secured in order to attain a mechanical strength, a sufficient area of light detecting part may not be obtained on the side of the surface formed with pn junctions.

For solving the problem mentioned above, it is an object of the present invention to provide a photodiode array and radiation detector which can increase the aperture ratio, so as to improve the detection sensitivity, while securing the mechanical strength.

For achieving the above-mentioned object, the present invention provides a photodiode array comprising a semiconductor substrate having a plurality of incident side depressions on a light-incident side and a plurality of opposite-side depressions on the side opposite from the light-incident side; the opposite-side depressions corresponding to the incident-side depressions, respectively, and having a bottom provided with a pn junction.

In the photodiode array in accordance with the present invention, depressions are formed on both sides of the semiconductor substrate.

Since the respective bottom faces of the two sets of depressions oppose each other, the distance between the pn junction, formed at the bottom of the opposite-side depressions, and the light-incident surface, becomes shorter.

Since regions other than the region formed with the pn junction can be left with the original thickness of the substrate as a frame, the mechanical strength of the semiconductor substrate can be maintained.

The depressions can be formed by thinning the semiconductor substrate from both sides.

At the time of thinning, the bottom of depressions reduces its area as the thinning proceeds deeper in the substrate.

Therefore, if the distance between the pn junction and the light-incident surface is constant, the depression bottom surface area can be made greater in the case where both surfaces are formed with depressions than in the case where depressions are formed from one side alone, whereby the area of light detecting part can be increased, i.e., the aperture ratio can be improved.

If the bottom surface area of the incident-side depressions is greater than that of the opposite-side depressions, the amount of energy beams attenuated by thick frames surrounding the incident-side depressions can be reduced, whereby the aperture ratio can be improved.

The pn junction may extend from the bottom of the opposite-side depressions to an opposite-side frame surrounding the opposite-side depressions.

This can suppress influences of unnecessary carriers occurring between the bottom and the frame.

Further, since the p-type impurity diffusion layer extends to the opposite-side frame, an aluminum electrode for connecting a bump electrode formed at the opposite-side frame to the p-type impurity diffusion layer is not required to travel the inner side face of the opposite-side depressions, whereby the process becomes easier.

The incident-side frame surrounding the incident-side depressions may be formed with a high impurity concentration region doped with a high concentration of an impurity.

In this case, carriers generated by light incident on the incident-side frame are recombined in the high impurity concentration region and disappear, so that carriers migrating to the pn junction at the bottom of opposite-side depressions decrease, whereby the crosstalk between photodiodes can be reduced.

The incident-side frame surrounding the incident-side depressions may be formed like a lattice as seen in an incident direction of light to be detected.

In this case, coordinates are determined like a matrix for respective positions of the incident-side depressions, whereby the incident position of the light to be detected can be discerned easily.

This photodiode array may comprise an electrode pad, disposed on the opposite-side frame surrounding the opposite-side depressions, for taking out an output of a photodiode constituted by the pn junction.

In this case, at the time of implementation, the electrode pad on the frame corresponding to a projection as seen from a depression can be brought into contact with an implemented wiring board, whereby wiring becomes easier on the board.

The photodiode array may comprise a wiring electrode passing a side face part of the opposite-side depressions so as to electrically connect a photodiode and the electrode pad to each other.

Namely, the wiring electrode can connect the photodiode and the electrode pad to each other at a position not blocking the light to be detected entering from the backside, and can supply a bias voltage from the electrode pad to the photodiode or take out a signal from the latter.

The present invention provides a radiation detector comprising the photodiode array and a scintillator disposed in front of an incident surface of the photodiode array for light to be detected.

Energy beams irradiating the scintillator, such as X rays, are converted into visible light, which can be detected by photodiodes comprising pn junctions.

In another aspect, the present invention provides a photodiode array comprising a semiconductor substrate formed with a plurality of pn junction type photodiodes in an array on a side opposite from an incident surface of the light to be detected; the semiconductor substrate being thinned in a region formed with the plurality of photodiodes from the incident side of the light to be detected, such that a region held between regions formed with the plurality of photodiodes becomes a projection having a cross section projecting toward the incident surface of the light to be detected; the projections being formed with a high concentration impurity region having the same conductivity type as with the incident side of the photodiodes for the light to be detected.

In this photodiode array, carriers generated by light incident on the projection having a projecting cross section are recombined in the high impurity concentration region and disappear, whereby the crosstalk between photodiodes can be reduced. At the same time, only regions formed with photodiodes are thinned, whereas the other regions keep their original thickness, whereby the mechanical strength of the whole substrate can be kept, which can restrain the substrate itself from being warped, distorted, and so forth.

In still another aspect, the present invention provides a photodiode array comprising a semiconductor substrate having a first conductivity type at least on a side opposite from incident surface of the light to be detected, and a plurality of light-detecting layers having a second conductivity type arranged in an array within a first conductivity type region on the opposite side of the semiconductor substrate; wherein the incident side of the semiconductor substrate for the light to be detected is formed with a plurality of depressions arranged in an array by thinning regions corresponding to the light-detecting layers from the incident side; and wherein a projection partitioning the plurality of depressions is doped with a high concentration of an impurity having the first conductivity type.

In still another aspect, the present invention provides a photodiode array comprising a semiconductor substrate doped with a high concentration of an impurity having a first conductivity type; a semiconductor layer of the first conductivity type disposed in contact with a side opposite from an incident surface of the semiconductor substrate for light to be detected; and a plurality of light-detecting layers having a second conductivity type arranged in an array within the semiconductor layer having the first conductivity type; the semiconductor substrate being formed like a lattice by eliminating regions corresponding to the light-detecting layers.

The photodiode array of the present invention may comprise an etching stop layer disposed between the semiconductor substrate and the semiconductor layer.

Since this photodiode has the etching stop layer, this layer can stop etching in a depression forming step, whereby this step can be controlled easily.

The photodiode array of the present invention may comprise an insulating layer disposed between the semiconductor substrate and the semiconductor layer.

Since this photodiode has the insulating layer between the semiconductor substrate and the semiconductor layer, the insulating layer blocks carriers generated in the semiconductor substrate from reaching the pn junction of the photodiode within the semiconductor layer, whereby the crosstalk can further be reduced.

In the photodiode array of the present invention, the semiconductor substrate and the semiconductor layer may have respective crystal orientations intersecting each other in an interface therebetween.

In this photodiode array, since the semiconductor substrate and semiconductor layer have respective crystal orientations intersecting each other in the interface therebetween, the interface between the semiconductor substrate and semiconductor layer can stop etching in the depression forming step, whereby this step can be controlled easily.

The present invention provides a method of making a photodiode array comprising a first step of preparing a substrate formed from a semiconductor of a first conductivity type at least on an incident side of light to be detected and on a side opposite therefrom, and doped with an impurity of the first conductivity type on the incident surface side; a second step of forming a plurality of photosensitive layers arranged in an array within a first conductivity type region on the opposite side of the substrate; and a third step of etching and thinning regions corresponding to the photosensitive layers in the substrate from the incident side so as to form a plurality of depressions arranged in an array and a lattice-like projection, doped with a high concentration of an impurity having the first conductivity type, partitioning the depressions.

In the method of making a photodiode array in accordance with the present invention, the first step may comprise a substep of preparing a semiconductor substrate of the first conductivity type, and a substep of doping the semiconductor substrate with a high concentration of an impurity having the first conductivity type on the incident side of the light to be detected.

This method makes the impurity concentration in the substrate higher toward the incident side of the light to be detected, thus yielding a higher impurity concentration in the projection, unlike cases where impurity regions of the first conductivity type are formed by other methods (e.g., bonding of substrates). This enhances the effect of recombining/extinguishing carriers generated, thereby improving the effect of reducing dark currents, leak currents, and crosstalk.

In the method of making a photodiode array in accordance with the present invention, the first step may comprise a substep of preparing a semiconductor substrate doped with a high concentration of an impurity having the first conductivity type, and a substep of growing a crystal of a semiconductor layer of the first conductivity type on the side opposite from the incident surface of the semiconductor substrate for the light to be detected.

Since the semiconductor layer of the first conductivity type is formed by crystal growth in this method, a flat surface of depressions can be formed by an etching step.

Since the semiconductor substrate doped with a high concentration of an impurity having the first conductivity type can be made thicker with a uniform concentration in the depth direction in this method, carriers generated by light ranging from short to long wavelengths incident on the projection can be recombined, which is effective in reducing crosstalk.

In the method of making a photodiode array in accordance with the present invention, the first step may comprise a substep of preparing a semiconductor substrate doped with a high concentration of an impurity having the first conductivity type, and a substep of bonding a semiconductor thin sheet of the first conductivity type to the semiconductor substrate on the side opposite from the incident surface of the semiconductor substrate for the light to be detected, the semiconductor substrate and the semiconductor thin sheet having respective crystal orientations intersecting each other in an interface of bonding.

In this method, since the semiconductor substrate and semiconductor thin sheet have crystal orientations intersecting each other in the bonding interface, the interface between the semiconductor substrate and semiconductor thin sheet can stop etching in a depression forming step, whereby this step can be controlled easily.

Since the semiconductor substrate doped with a high concentration of an impurity having the first conductivity type can be made thicker with a uniform concentration in the depth direction in this method, carriers generated by light ranging from short to long wavelengths incident on the projection can be recombined, which is effective in reducing crosstalk.

In the method of making a photodiode array in accordance with the present invention, the first step may comprise a substep of preparing a semiconductor substrate doped with a high concentration of an impurity having the first conductivity type, and a substep of bonding a semiconductor thin sheet of the first conductivity type to the side opposite from the incident surface of the light to be detected in the semiconductor substrate by way of an etching stop layer.

In this method, since the etching stop layer is provided between the semiconductor substrate doped with a high concentration of an impurity having the first conductivity type and the semiconductor thin sheet of the first conductivity type, this layer can stop etching in a depression forming step, whereby this step can be controlled easily.

In the method of making a photodiode array in accordance with the present invention, the first step may comprise a substep of preparing a semiconductor substrate doped with a high concentration of an impurity having the first conductivity type, and a substep of bonding a semiconductor thin sheet of the first conductivity type to the side opposite from the incident surface of the light to be detected in the semiconductor substrate by way of an insulating layer.

This method forms an insulating layer between the semiconductor substrate and the semiconductor layer. Therefore, the insulating layer stops carriers generated in the semiconductor substrate from reaching photodiode photosensitive surfaces within the semiconductor layer, whereby a photodiode array which can further reduce crosstalk can be made.

In still another aspect, the present invention provides a radiation detector comprising any of the photodiode arrays of the present invention; and a scintillator panel, attached to the photodiode array on an incident surface side of the light to be detected, emitting light when radiation is incident thereon.

In still another aspect, the present invention provides a radiation detector comprising the photodiode array made by any of the methods of the present invention; and a scintillator panel, attached to the photodiode array on an incident surface side of the light to be detected, emitting light when radiation is incident thereon.

Each of these radiation detectors comprises a photodiode array of the present invention. Therefore, carriers generated in the projections of the photodiode array are recombined and disappear, whereby dark currents and crosstalk can be reduced. Also, since the depressions of the photodiode array have a light-detecting region, the latter is less likely to incur mechanical damages at the time of implementation, whereby defects are hard to occur in the photosensitive region.

BRIEF DESCRIPTION OF THE DRAWINGS

FIG. 5 is a view for explaining a step of making the photodiode array in accordance with the first embodiment;

FIG. 6 is a view for explaining a step of making the photodiode array in accordance with the first embodiment;

FIG. 7 is a view for explaining a step of making the photodiode array in accordance with the first embodiment;

FIG. 8 is a view for explaining a step of making the photodiode array in accordance with the first embodiment;

FIG. 9 is a view for explaining a step of making the photodiode array in accordance with the first embodiment;

FIG. 10 is a view for explaining a step of making the photodiode array in accordance with the first embodiment;

FIG. 11 is a view for explaining a step of making the photodiode array in accordance with the first embodiment;

FIG. 12 is a view for explaining a step of making the photodiode array in accordance with the first embodiment;

DESCRIPTION OF THE PREFERRED EMBODIMENTS

In the following, radiation imaging apparatus in accordance with embodiments will be explained with reference to the drawings. In the explanation, constituents identical to each other or those having functions identical to each other will be referred to with numerals identical to each other, without repeating their overlapping descriptions.

First Embodiment

Figure 1:
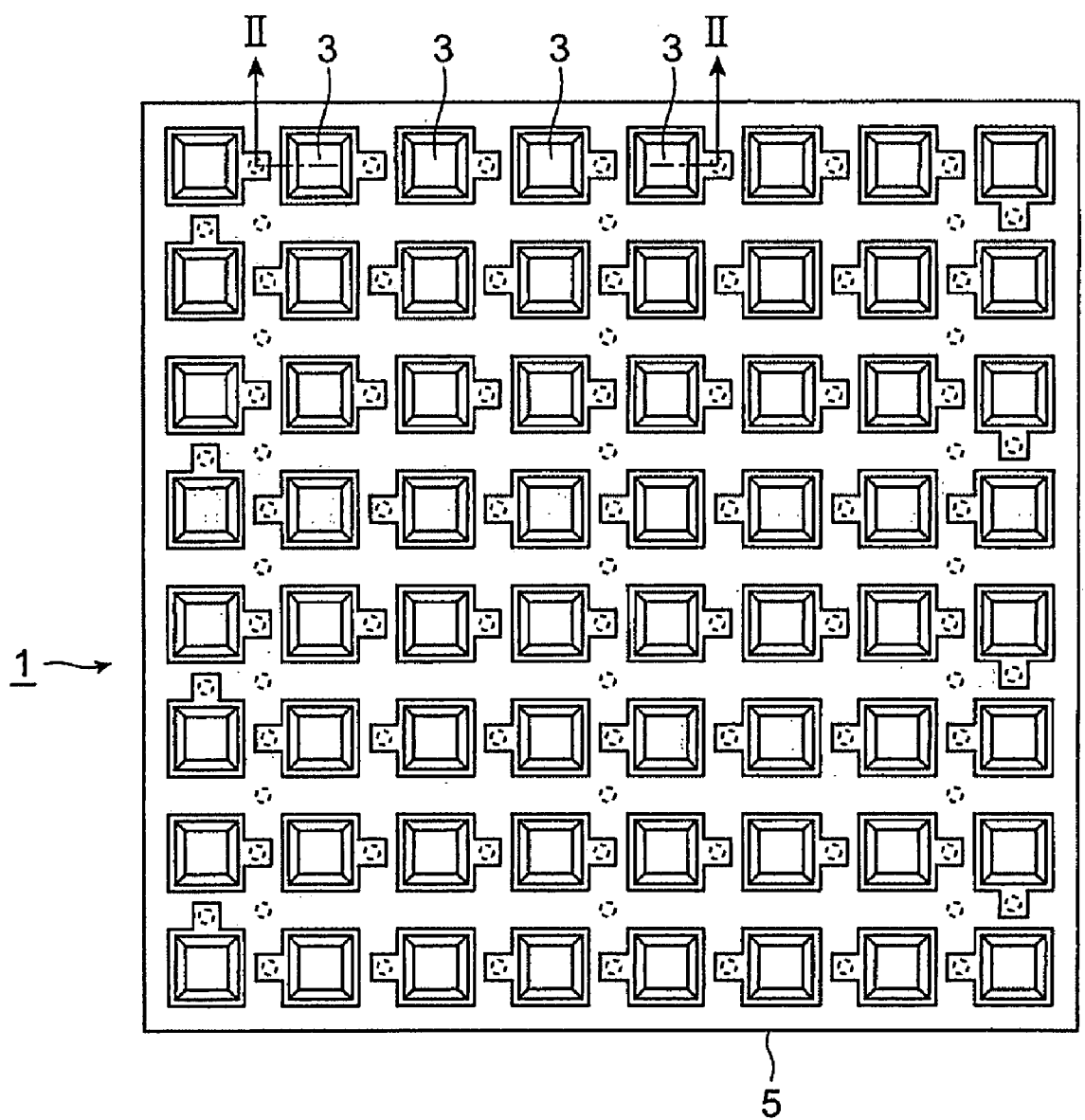
FIG. 1 is a schematic plan view of the photodiode array in accordance with a first embodiment.
Figure 2:
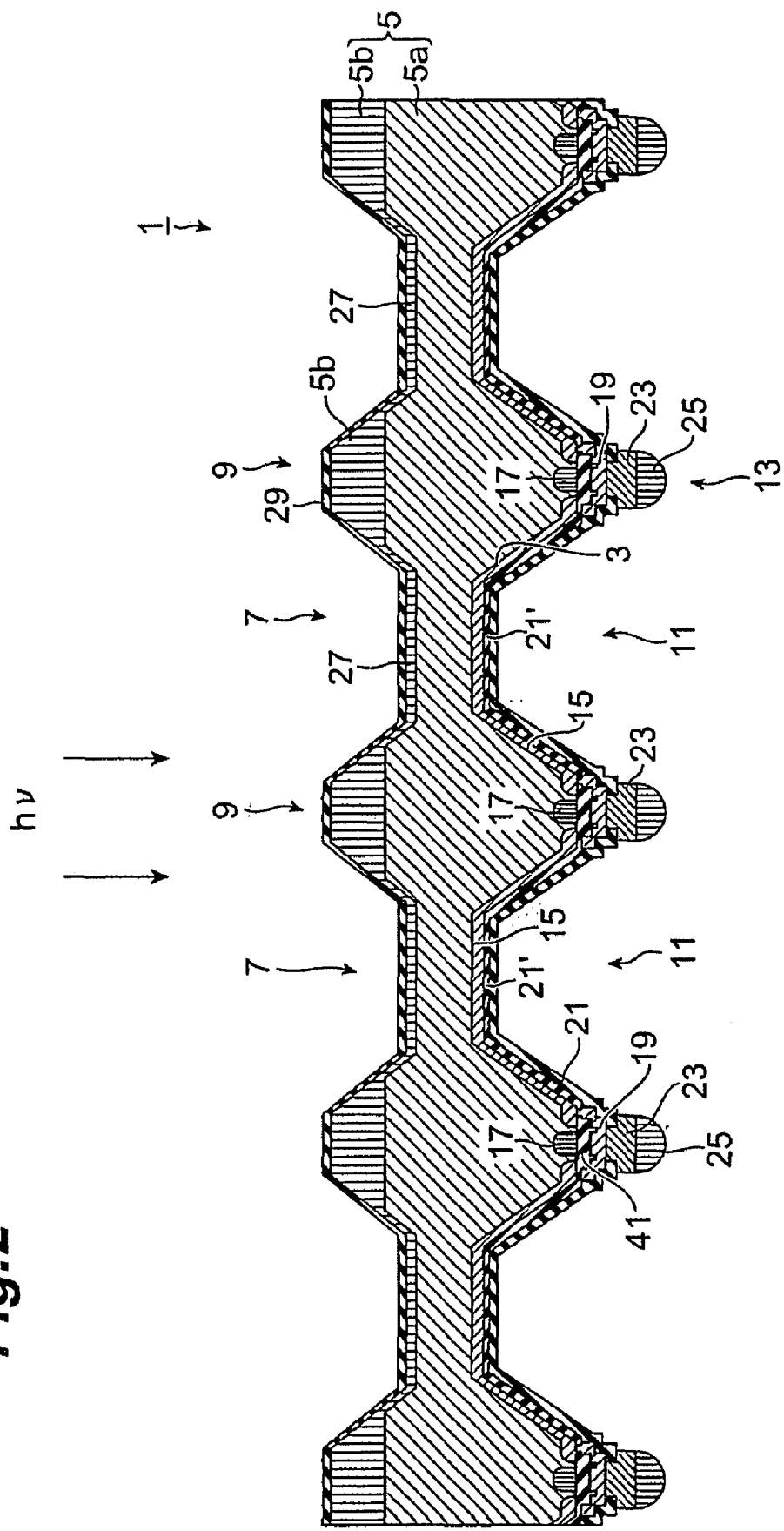
FIG. 2 is a sectional view of the photodiode array in accordance with the first embodiment.
Figure 3:
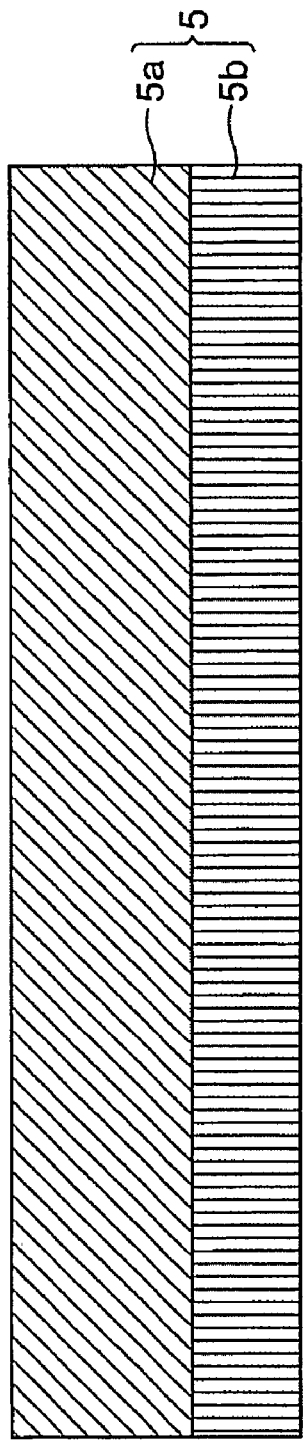
FIG. 3 is a view for explaining a step of making the photodiode array in accordance with the first embodiment.

FIG. 1 is a plan view of the photodiode array in accordance with an embodiment as seen from its front side, whereas FIG. 2 is a sectional view of the photodiode array taken along the line II—II of FIG. 1. In the following explanation, the incident surface for light to be detected will be referred to as backside, whereas the side opposite therefrom will be referred to as front side.

As shown in FIG. 1, the photodiode array 1 in accordance with this embodiment includes a plurality of pn junctions 3 regularly arranged in a two-dimensional matrix, whereas each pn junction functions as a photosensitive pixel of a photodiode.

The photodiode array 1 comprises an n-type semiconductor substrate 5 made of silicon (Si). The n-type semiconductor substrate 5 includes an n-type semiconductor layer 5a and an n$^+$-type high impurity concentration layer 5b formed by diffusing an n-type impurity from the backside of the substrate.

The backside of the n-type semiconductor substrate 5 is thinned by forming depressions in a quadrangular pyramid shape having a predetermined size/depth with a predetermined pitch for constructing aimed photosensitive pixels. These thinned parts (depressions) constitute incident-side depressions 7 and are arranged two-dimensionally. Regions held between adjacent incident-side depressions 7 constitute incident-side frames 9 surrounding the incident-side depressions 7.

The front side of the n-type semiconductor substrate 5 is thinned at positions corresponding to the incident-side depressions 7, so as to form opposite-side depressions 11, which are arranged two-dimensionally. Regions held between adjacent opposite-side depressions 11 constitute opposite-side frames 13 surrounding the opposite-side depressions 11. In the n-type semiconductor substrate 5, thin parts which are thinned parts held between the incident-side depressions 7 and opposite-side depressions 11 in the thickness direction are arranged in an array.

The part other than the thinned parts in the n-type semiconductor substrate 5 is constructed as a thick part by the incident-side frames 9 and opposite-side frames 13. Since the thin parts are arranged into a two-dimensional matrix with a predetermined pitch and a predetermined size, the thick part acting as frames is formed like a lattice as seen in an incident direction of light to be detected. In this case, coordinates are determined like a matrix for respective positions of the incident-side depressions, whereby the incident position of the light to be detected can be discerned easily.

The inner side faces of the opposite-side depressions 11 and incident-side depressions 7 each form an angle of about 55° with the substrate surface, thereby constructing truncated quadrangular pyramids. The opposite-side depressions 11 and incident-side depressions 7 may be either similar to each other or not, and their depths may be either identical or different. This example is set such that the depth of the incident-side depressions 7 is smaller than that of the opposite-side depressions 11, so that the bottom face of each incident-side depression 7 has an area larger than that of the bottom face of each opposite-side depression 11. This can reduce the quantity of energy beams attenuated by the thick frames surrounding the incident-side depressions 7, thereby improving the aperture ratio.

The n-type semiconductor substrate 5 has a thickness of 100 to 350 μm, whereas the semiconductor layer 5a has an impurity concentration of $1\times10^{12}$ to $10^{15}/cm^3$. The incident-side depressions 7, each having a size of 1 mm×1 mm with a depth of about 50 μm, are arranged with a pitch of 1.5 mm in both longitudinal and lateral directions. The opposite-side depressions 11 have a size smaller than that of the incident-side depressions 7 and are arranged with the same pitch as with the incident-side depressions 7.

In each opposite-side depression 11, a p-type impurity diffusion layer 15 continuously extends from the opposite-side frame 13 surrounding the opposite-side depression 11 to the bottom face of the opposite-side frame 11. The pn junction 3 formed between the n-type semiconductor substrate 5 and the p-type impurity diffusion layer 15 constructs a photosensitive pixel of a photodiode. Disposed between p-type impurity diffusion layers 15 adjacent each other is an $n^+$-type impurity region (separation layer) 17 acting as a channel stopper for separating photodiodes from each other.

Each p-type impurity diffusion layers 15 has an impurity concentration of $1\times10^{13}$ to $10^{20}/cm^3$, and the $n^+$-type impurity region (separation layer) 17 also has an impurity concentration of $1\times10^{13}$ to $10^{20}/cm^3$.

The p-type impurity diffusion layer 15 is in contact with and connected to an aluminum electrode 19 (wiring electrode) disposed on the opposite-side frame 13, so as to make electrical contact with the outside from the front side by way of the aluminum electrode 19, an under-bump metal (hereinafter referred to as "UBM") 23, and a bump electrode 25 (electrode pad), so that the output of the photodiode can be taken out therefrom.

In this embodiment, the p-type impurity diffusion layer 15 is formed so as to extend to the opposite-side frame 13 and approach the bump electrode 25, whereas the aluminum electrode 19 is formed on the opposite-side frame 13 so as to electrically connect the p-type impurity diffusion layer 15 and the UBM 23 to each other. In the case where the p-type impurity diffusion layer 15 is formed on the bottom of the opposite-side depression 11 alone, the aluminum electrode is formed on the side face part inside the opposite-side depression 11 so as to connect the p-type impurity diffusion layer 15 to the bump electrode 25 disposed at the opposite-side frame 13. The UBM 23 penetrates through a passivation layer 21 made of SiN or $SiO_2$, and so on, in the thickness direction, thereby electrically connecting the aluminum electrode 19 and bump electrode 25 to each other.

Though not depicted, a substrate electrode can also be taken out by making a contact hole in the separation layer ($n^+$), and forming an aluminum electrode, a UBM, and a bump electrode on the opposite-side frame 13 in a similar manner.

The backside of the n-type semiconductor substrate 5 is formed with an accumulation layer 27 so as to cover the whole backside continuously from the incident-side depression 7 to the incident-side frame 9. The accumulation layer 27 has a high impurity concentration due to $n^+$-type impurity diffusion, and connects with the $n^+$-type high impurity concentration layer 5b in the region corresponding to the incident-side frame 9. Namely, the incident-side frame 9 includes a region occupied by the $n^+$-type high impurity concentration layer 5b doped with a high concentration of an impurity.

The accumulation layer 27 acts to recombine unnecessary carriers occurring on the backside, and guide carriers toward pn junctions by a built-in electric field derived from the diffusion potential, in order to attain higher sensitivity and lower dark currents. The accumulation layer 27 has an impurity concentration of $1\times10^{15}$ to $10^{20}/cm^3$, and a thickness of 0.1 μm to several μm. Disposed on further backside of the accumulation layer 27 is a silicon oxide film 29, which functions as an anti reflection film (AR coat).

As mentioned above, in the photodiode array 1 of this embodiment, regions corresponding to the pn junctions 3 are thinned from both the backside and front side, so as to reduce the thickness of the substrate. By contrast, the region other than the thinned regions is left with the original thickness of the substrate, thereby forming thick frames surrounding the depressions. The incident-side frame 9 is formed with the $n^+$-type high impurity concentration layer 5b, which is a region with a high impurity concentration. The $n^+$-type high impurity concentration layer 5b has an impurity concentration of $1\times10^{15}$ to $10^{20}/cm^3$.

A method of making the photodiode array 1 in accordance with this embodiment will now be explained with reference to FIGS. 3 to 12.

First, a substrate 5 having a thickness on the order of 150 μm to 500 μm made of n-type silicon with a crystal plane (100) is prepared. An $n^+$-type high impurity concentration layer 5b is formed by thermal diffusion on the backside of the n-type silicon substrate 5, so as to produce a substrate having a two-layer structure of an n-type semiconductor layer 5a and the $n^+$-type high impurity concentration layer 5b (see FIG. 3).

Figure 4:
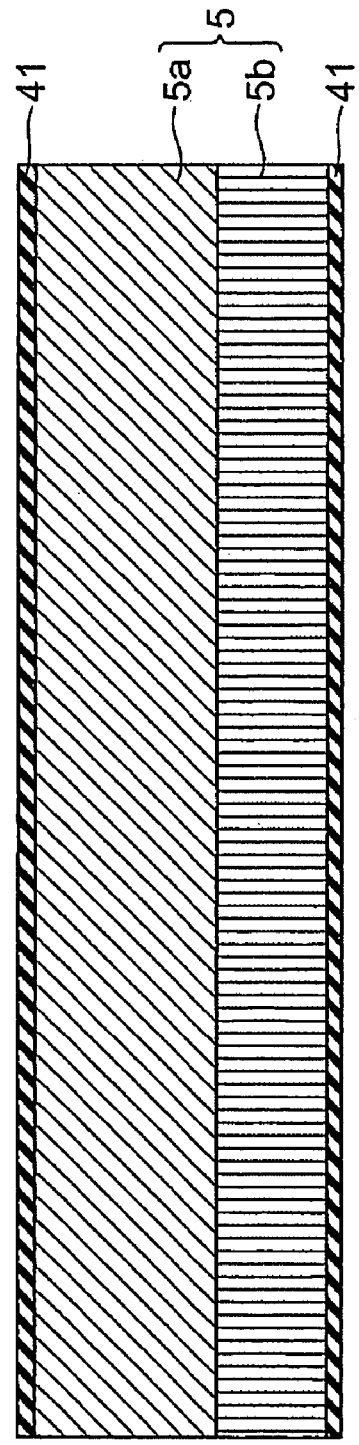
FIG. 4 is a view for explaining a step of making the photodiode array in accordance with the first embodiment.

Subsequently, the front side and backside of the substrate are subjected to thermal oxidization, so as to form an silicon thermal oxidization film 41 (see FIG. 4). The silicon thermal oxidization film 41 is utilized as a doping mask for a high-concentration n-type impurity in a later step.

Then, a separation layer 17 is formed. Using a photolithography and an etchant, the silicon thermal oxidization film 41 is perforated at positions for forming the separation layer 17. Further, using the silicon thermal oxidization film 41 as a mask, phosphorus is thermally doped into the substrate, so as to form the separation layer 17, and the substrate is thermally oxidized, so as to close the perforations (see FIG. 5).

Next, using a photolithography and an etchant, the silicon thermal oxidization film 41 is perforated in regions between areas of the separation layer 17. Further, using the thermal oxidization film as a mask, boron is thermally doped into the substrate, so as to form a p-type impurity diffusion layer 15, which is then thermally oxidized, so as to close the perforations. This forms a matrix of a plurality of pn junctions 3 separated from each other by the separation layer 17, each pn junction 3 acting as a part corresponding to a photosensitive pixel (see FIG. 6). Here, the pn junctions constituting photodiodes are formed between the p-type impurity diffusion layer 15 and the n-type semiconductor layer 5a.

Subsequently, the backside of the substrate is ground chemically and mechanically in order for photosensitive regions to attain a desirable thickness.

Silicon nitride (SiN) films 43 are formed on the front side and backside of the substrate by plasma CVD (Chemical Vapor Deposition) or LP-CVD (Low Pressure Chemical Vapor Deposition), and then are etched away in parts corresponding to opposite-side depressions 11 and incident-side depressions 7.

Namely, the SiN film 43 is initially formed on the opposite side, and is etched away in regions on the pn junctions 3 by using a photoresist patterned by photolithography as a mask, so as to expose the surface of the p-type impurity diffusion layer 15 (see FIG. 7).

Subsequently, the opposite side of the substrate is subjected to anisotropic etching by alkali etching (using a sodium hydroxide solution, TMAH, or the like). This forms opposite-side depressions 11 in respective parts corresponding to photosensitive pixels, whereas the remaining parts become opposite-side frames 13 surrounding the opposite-side depressions 11. This etching is carried out until the depth reaches at least 2 μm. A p-type impurity is diffused or ion-implanted from the exposed surface on the opposite side, so as to form the p-type impurity layer 15 within the depressions as well. Then, a thermal oxidation film 21' is formed so as to cover the inner faces of the depressions.

Similarly, on the backside of the substrate acting as the light incident side, the SiN layer 43 and the silicon thermally oxidization film 41 perforated at the respective positions opposing the opposite-side depressions 11 is formed. Using this layer as a mask (see FIG. 8), the substrate is subjected to anisotropic etching, so as to form incident-side depressions 7 at respective positions corresponding to the opposite-side depressions 11, and incident-side frames 9 surrounding the incident-side depressions 7. The etching is carried out until the depth becomes at least 2 μm, while leaving a substrate thickness which prevents at least the pn junctions 3 on the front side and an accumulation layer 27 to be formed later on the backside from competing with each other After eliminating the silicon nitride films 43 located on both sides of the substrate, an n-type ion species (arsenic) is ion-implanted into depressions on the backside by way of the thermal oxidization film 45, so as to form the accumulation layer 27 having an impurity concentration of $10^{15}$ to $10^{20}/cm^3$. Then the thermal oxidization film 45 is formed. As a consequence, the $n^+$-type high impurity concentration layer 5b is integrated with the accumulation layer 27. The accumulation layer 27 is set to a thickness not reaching the pn junctions 3 on the front side.

Subsequently, an AR coat 29 for attaining a desirable spectral characteristic is formed on the backside (see FIG. 9). The thermal oxidization film 45 itself may be employed as the AR coat 29 or, while eliminating the buffer oxidization layer, the remaining film thickness may be adjusted by repeating thermal oxidation or carrying out additional thermal oxidation, so as to form the AR coat 29. The AR coat 29 may also be formed by a composite film or laminated film formed by the thermal oxidization film with SiN or an optical thin film or the like.

Thereafter, contact holes of the p-type impurity diffusion layer 15 are formed in the thermal oxidization film 21' on the front side, and aluminum electrodes 19 are formed so as to be buried in at least the contact holes (see FIG. 10). A passivation layer 21 is patterned on the aluminum electrodes 19 while in a state perforated in parts for forming bump electrodes. It will be sufficient for the aluminum electrode 19 to be formed so as to electrically connect the p-type impurity diffusion layer 15 and the bump electrodes to each other.

Though not depicted, a substrate electrode may be similarly provided with a bump electrode by way of the separation layer 17.

The passivation layer 21 may utilize SiN and $SiO_2$ formed by plasma CVD, PSG, PSAG, SiON, polyimide resins, acrylic resins, epoxy resins, urethane resins, or composite materials including them.

When solder, which is poor in wettability with respect to aluminum, is used as a bump electrode, a UBM 23 for intervening between aluminum and a solder bump electrode 25 is formed within a perforation of the passivation layer 21 (see FIG. 11), and the solder bump electrode 25 is superposed on the UBM 23 (see FIG. 12). As the UBM 23, Ni—Au is formed by electroless plating. The UBM 23 may also be realized by forming Ti—Pt—Au or Cr—Au by liftoff.

The solder bumps can be obtained by forming solder at predetermined UBM parts by solder ball mounting or printing, and then causing thus formed solder to reflow. Without being restricted to solder bumps, the bumps may be electrically conductive bumps including metals, such as gold bumps, nickel bumps, copper bumps, and electrically conductive resin bumps.

In the photodiode array 1, the pn junctions 3 are formed in regions of the semiconductor substrate thinned from both sides, whereby the substrate retains its original thickness as a frame in regions other than those formed with the pn junctions 3 while reducing the distance between each pn junction 3 and the light incident surface, thus making it possible to keep the mechanical strength of the substrate as a whole. Also, the photodiode array 1 is thinned from both sides of the substrate, so as to form depressions.

Figure 13A:
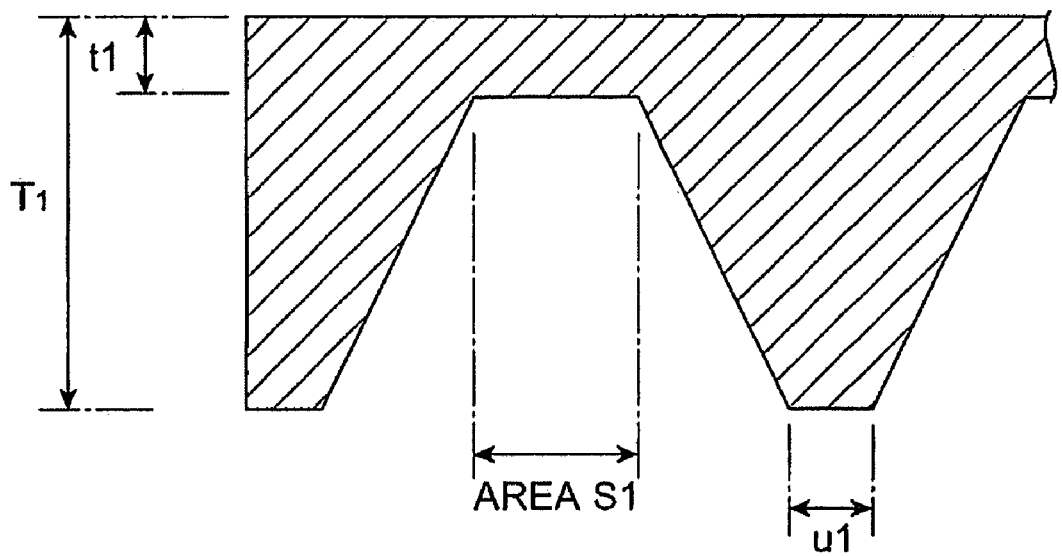
FIG. 13A is a schematic sectional view of the photodiode array in accordance with the first embodiment.
Figure 13B:
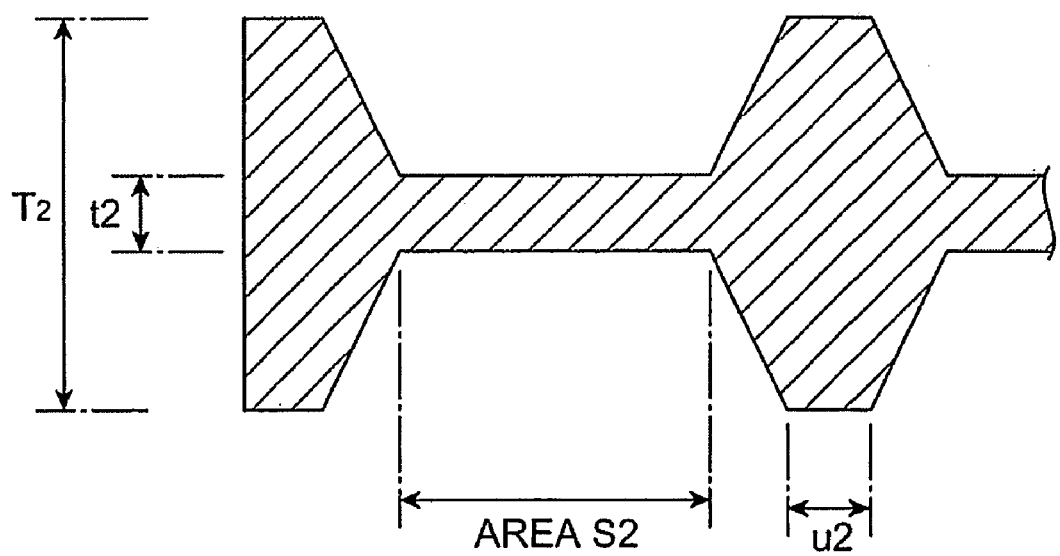
FIG. 13B is a schematic sectional view of the photodiode array in accordance with a comparative example.

FIGS. 13A and 13B schematically show respective cross-sectional forms of a photodiode array thinned from only one side of its substrate, and the photodiode array in accordance with this embodiment thinned from both sides of its substrate. It is seen that, though both of them are identical in terms of the thickness of the substrate (T1, T2), the thickness of the photodiode region (t1, t2), and the width of the frame (u1, u2), the photodiode array in accordance with this embodiment is greater in terms of the depression bottom face area (S1, S2). Therefore, even when the distance between the pn junction 3 and the light incident surface and the width of the frame are held constant, the depression bottom face area becomes larger in the case where both sides are etched than in the case where depressions are formed from only one side, whereby the photodiode array 1 in accordance with this embodiment can secure a greater photosensitive area, thus making it possible to improve the aperture ratio.

In the photodiode array 1, when forming opposite-side depressions 11, edge parts between their inner side face and the opposite-side frames 13 are susceptible to damages and stresses, whereby unnecessary carriers are likely to occur. Since the p-type impurity diffusion layer 15 is formed so as to extend from the opposite-side frame 13 to the bottom of the opposite-side depression 11 by way of the inner side face of the opposite-side depression 11, the edge parts are constituted by the p-type impurity diffusion layer 15. Therefore, influences of the unnecessary carriers generated in the edge parts can be suppressed, whereby dark currents and crosstalk can be reduced.

In the photodiode array 1, the bottom face of the incident-side depressions 7 has an area larger than that of the bottom face of the opposite-side depressions 11. Therefore, carriers generated by the detection light incident on the incident-side frame 9 can be restrained from migrating to the pn-junction at the bottom face of the depression, whereby dark currents and crosstalk can be reduced.

In the photodiode array 1, since the $n^+$-type high impurity concentration layer 5b, which is a region having a high n-type impurity concentration, exists in the incident-side frame 9 and incident-side depressions 7, carriers generated when light is incident on the incident-side frame 9 are recombined and extinguished by the $n^+$-type high impurity concentration layer 5b, and thus are less likely to migrate to the p-type impurity diffusion layer 15. The thickness of the $n^+$-type high impurity concentration layer 5b may be set longer than the diffusion length of the carriers. As a consequence, the crosstalk between photodiodes generated by the light incident on the incident-side frame 9 corresponding to the gap between current channels flowing through the photodiodes can be reduced.

Since the frame (projection) 9 is used, the unnecessary carriers generated by the frame 9 (carriers with a long traveling distance to the electrode for outputting carriers) are trapped by the $n^+$-type high impurity concentration layer (insensitive region) 5b, and the wave-form of the photosensing has no tail, which is also effective in increasing the response speed. As the insensitive region provided in such a frame 9, insulating layers and the like may be employed as well.

In the photodiode array 1, since the bump electrode 25 is formed on the opposite-side frame 13, it can be brought into contact with an implemented wiring board in the opposite-side frame 13 at the time of implementation, whereby the wiring of the implemented wiring board can be kept from being complicated.

In the photodiode array 1, since the aluminum electrode 19 is formed on the inner side face of the opposite-side depression 11, the aluminum 19 can intervene between the p-type impurity diffusion layer 15 and the opposite-side frame 13 even when a photodiode is formed only on the bottom of the opposite-side depression 11, whereby the bump electrode 25 can be formed on the opposite-side frame 13.

Though the photodiode array of this embodiment forms the $n^+$-type high impurity concentration layer 5b on the backside of the n-type silicon substrate 5 by thermal diffusion, thereby producing the semiconductor substrate 5 of a two-layer structure having the n-type semiconductor layer 5a and $n^+$-type high impurity concentration layer 5b, an insulating film may be disposed between the two layers, or a semiconductor layer having a crystal orientation intersecting that of the two layers may be provided at the interface therewith, so as to function as an etching stop layer when forming the thin part, thereby making it easier to control the etching step.

An embodiment of the radiation detector in accordance with the present invention will now be explained.

Figure 14:
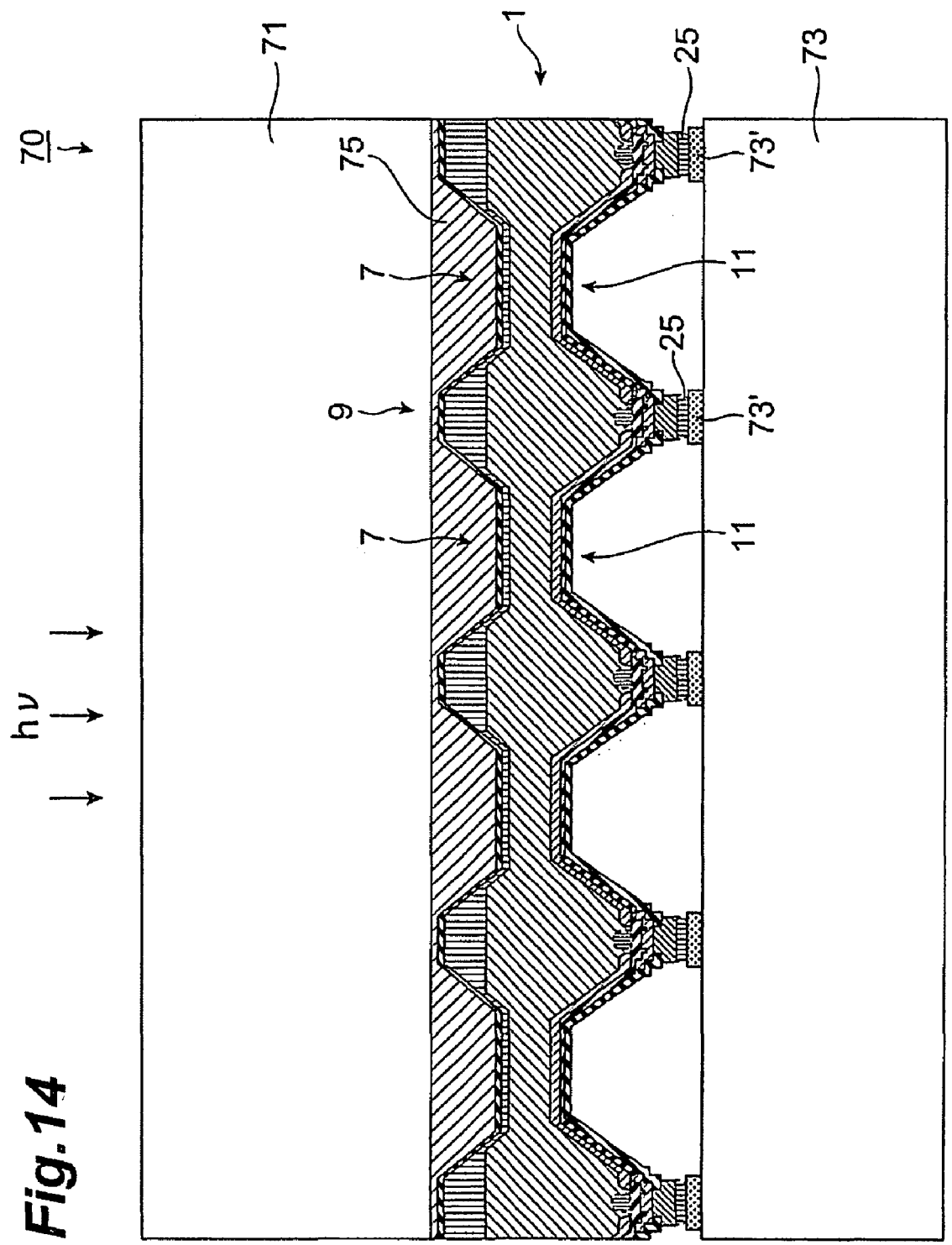
FIG. 14 is a sectional view of the radiation detector in accordance with the first embodiment.
Figure 15:
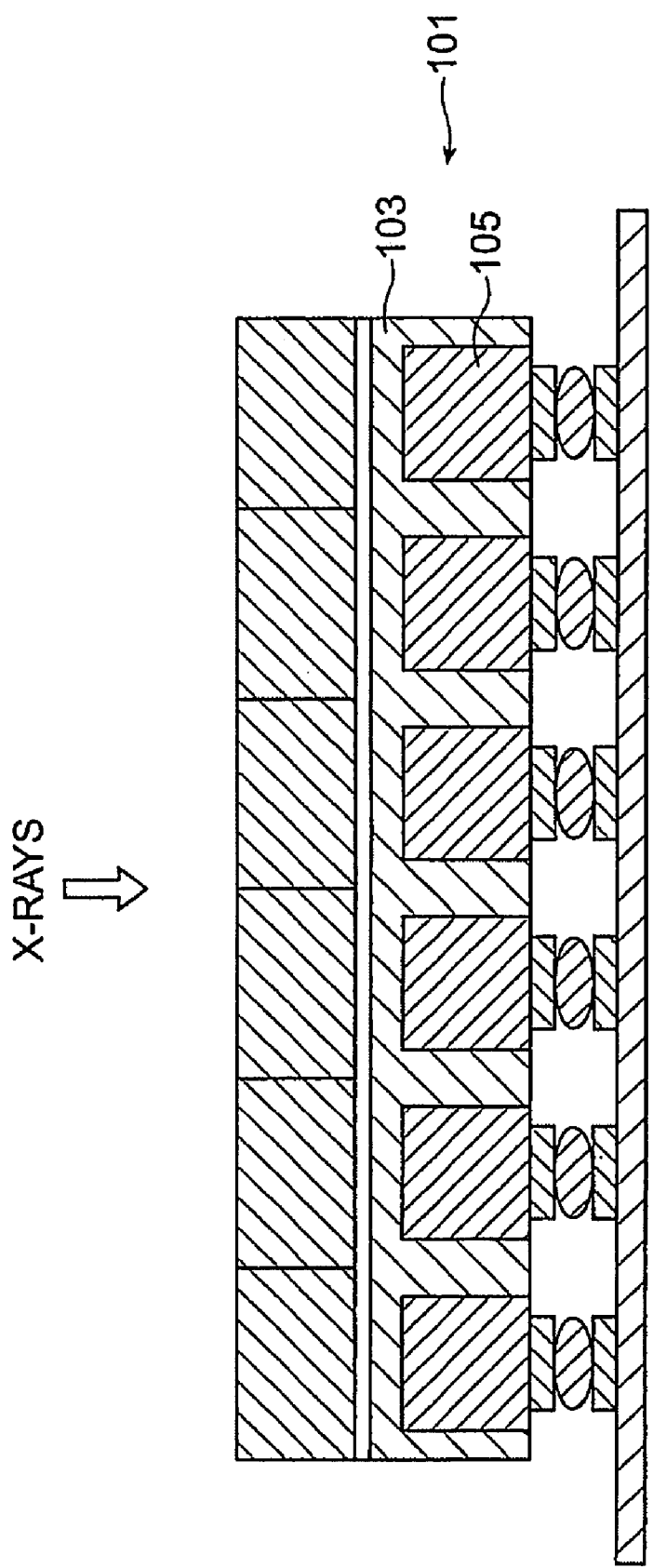
FIG. 15 is a sectional view of a photodiode array in accordance with the prior art.
Figure 16:
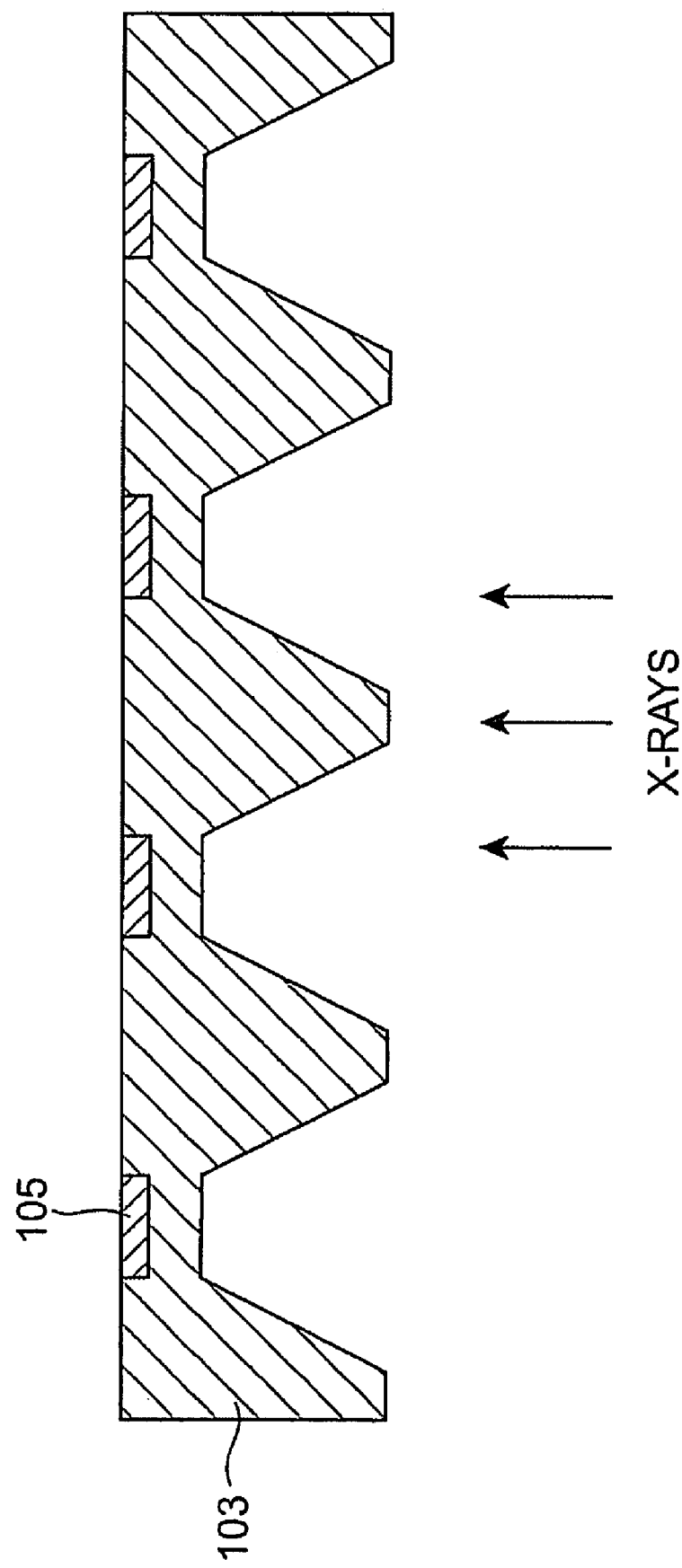
FIG. 16 is a schematic sectional view of the photodiode array in accordance with a comparative example.

FIG. 14 is a side sectional view of a radiation detector 70 in accordance with this embodiment. The radiation detector 70 comprises a scintillator 71 for generating fluorescence when radiation hv such as X-ray is incident thereon and emitting thus generated radiation from the opposite surface thereof; the photodiode array 1 for receiving the light emitted from the scintillator 71 and converting thus received light into an electric signal; and an implemented wiring board 73.

The scintillator 71 is placed on the backside of the photodiode array 1 and is in contact with the photodiode array 1 at the incident-side frame 9. Therefore, a gap exists between the scintillator 71 and the incident-side depressions 7. This gap is filled with a coupling resin 75 having substantially the same refractive index as effective for the luminescence of the scintillator 71 to propagate through, so that the light emitted from the scintillator 71 is efficiently incident on the photodiode array 1.

Wiring 73' on the implemented wiring board 73 is placed on the front side of the photodiode array 1, and is electrically connected by way of the bump electrodes 25 to individual photodiodes constituting the photodiode array 1. The mode of implementation is flip-chip mounting, whereas the bump electrodes 25 may use electrically conductive bumps including metals, such as gold bumps, nickel bumps, copper bumps, and electrically conductive resin bumps, and the like.

Employable as bonding modes are those of direct bonding, underfill resin filling, anisotropic conductive film (ACF), anisotropic conductive paste (ACP), nonconductive paste (NCP), and the like.

When bonding the photodiode array 1 onto the implemented wiring board 73, the incident-side frame 9 is attracted to a vacuum collet. At this time, the incident-side frame may be mechanically damaged, and the resulting defects may generate carriers to become dark currents and noise. When placing the scintillator 71 on the backside of the photodiode array 1, the scintillator 71 is brought into contact with the incident-side frame 9. At this time, the incident-side frame 9 may also be mechanically damaged, whereby unnecessary carriers may occur.

Since the radiation detector uses the photodiode array in accordance with the present invention, the incident-side frame 9 is constituted by the $n^+$-type diffusion layer 5b having a high impurity concentration, whereby the generated carriers can be recombined, so as to reduce such dark currents and noise.

Since the incident-side frame 9 is disposed between photosensitive pixels of the photodiode array 1, the incident light can be separated into individual pixels in the radiation detector. Further, since the incident-side frame 9 is constituted by the $n^+$-type diffusion layer 5b having a high impurity concentration, carriers generated by the light incident on the incident-side frame 9 are recombined. Therefore, the light incident on the gap between photosensitive pixels, i.e., on the frame 9, is restrained from being taken out as a signal. Namely, the radiation detector can suppress the crosstalk between photosensitive pixels.

If a photodiode array with no unevenness on the backside is used in the radiation detector, vacuum collets directly come into contact with photosensitive pixels when bonding the photodiode array onto the implemented wiring board 73. When mounting a scintillator, it directly comes into contact with photosensitive pixels in a similar manner, which may damage the photosensitive pixels, thus being likely to cause pixel defects. In the radiation detector, since the photosensitive pixel parts are arranged in the opposite-side depressions 11, the photosensitive pixels have no contact during the implementation step, and thus are less susceptible to mechanical damages, whereby photosensitive pixel defects can be prevented from occurring.

As explained in the foregoing, the photodiode array and radiation detector in accordance with the present invention can enhance the aperture ratio while improving the detection sensitivity and securing the mechanical strength.

A photodiode array having projections and depressions on only one side of a substrate will now be explained.

Figure 17:
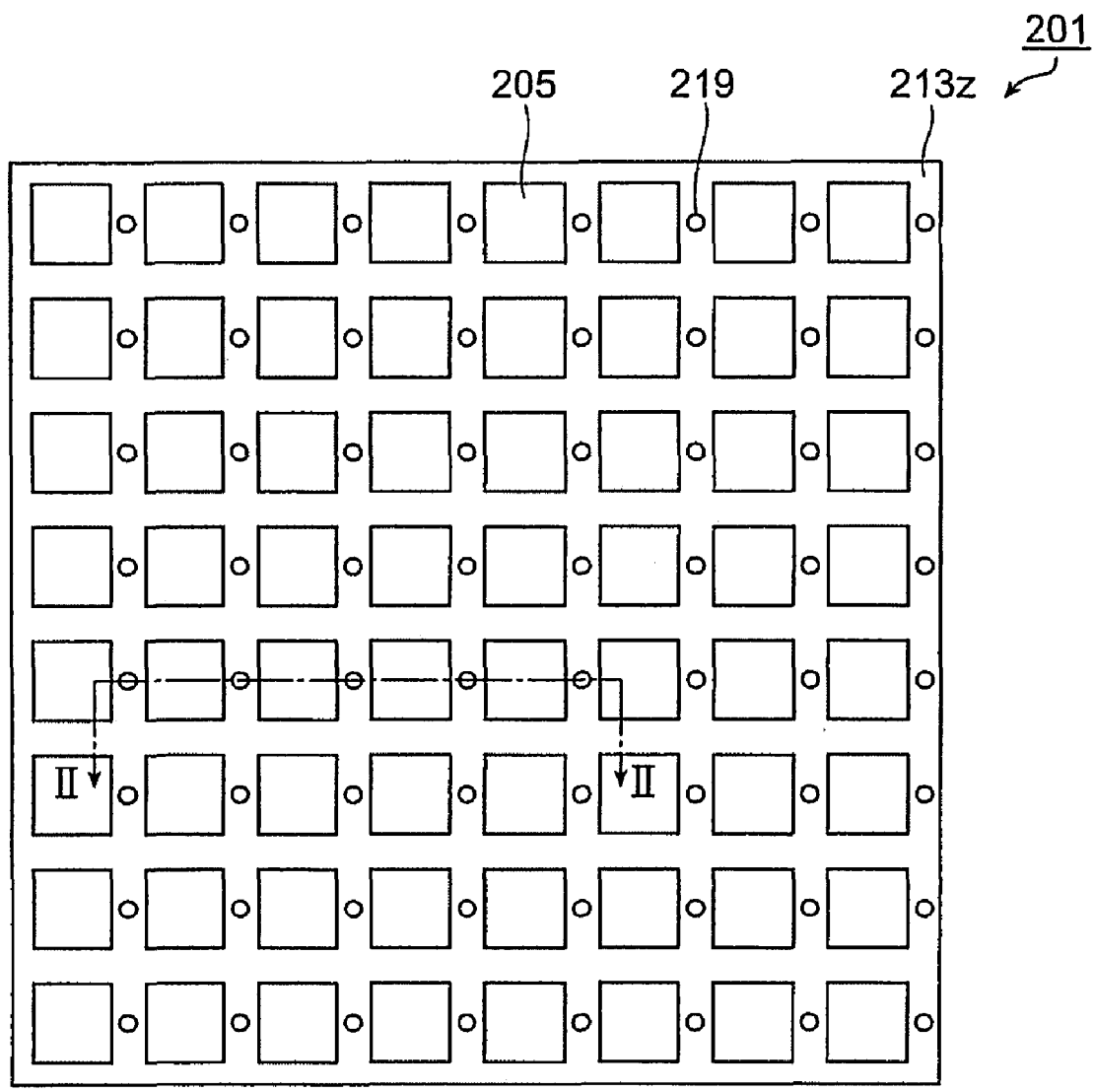
FIG. 17 is a top plan view of the photodiode array in accordance with a second embodiment.
Figure 18:
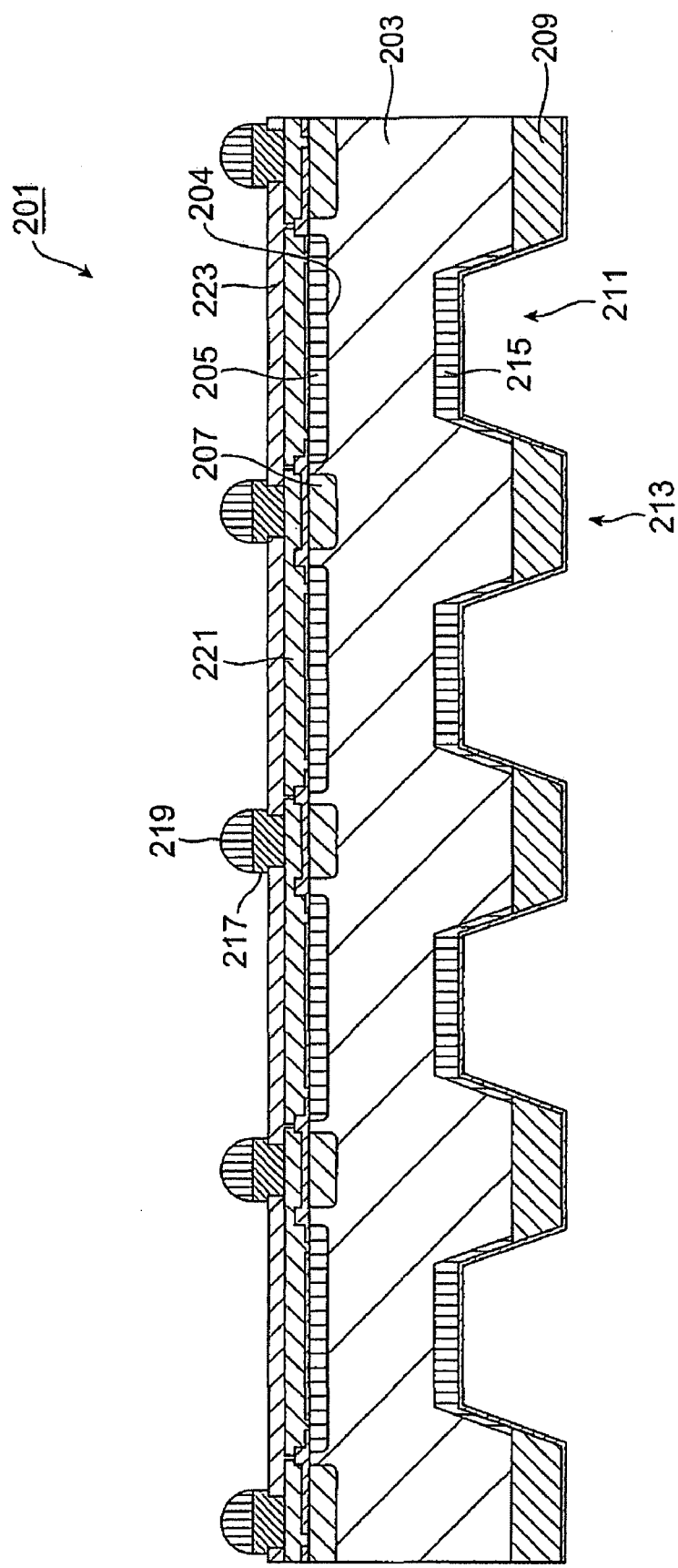
FIG. 18 is a side sectional view of the photodiode array in accordance with the second embodiment.
Figure 19:
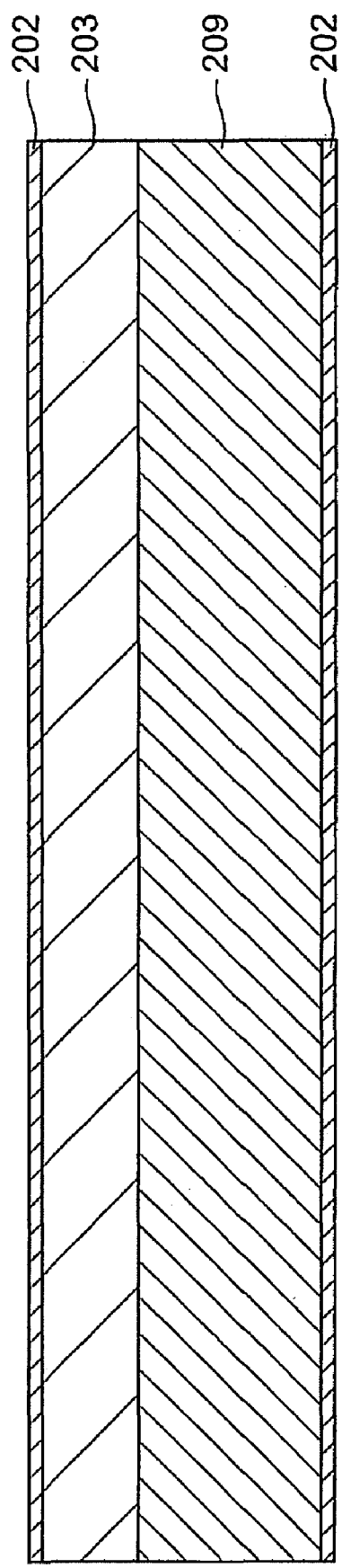
FIG. 19 is a view for explaining a step of making the photodiode array in accordance with the second embodiment.
Figure 20:
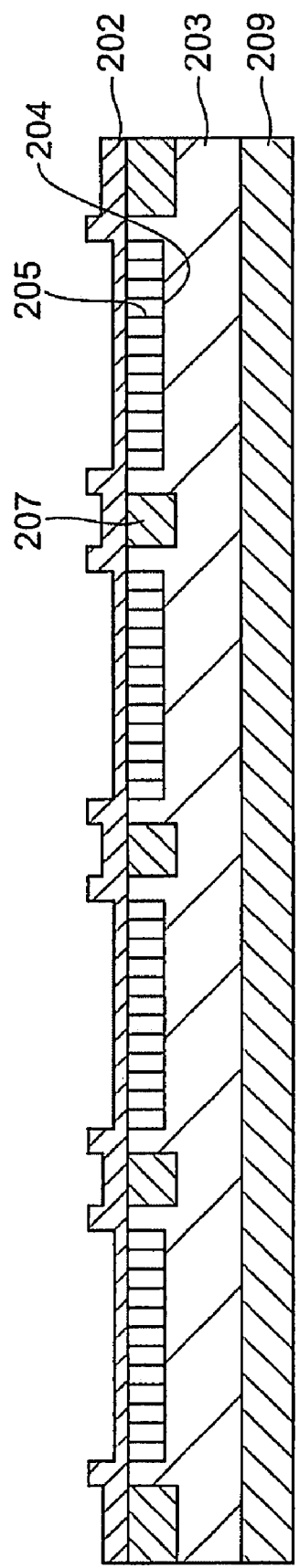
FIG. 20 is a view for explaining a step of making the photodiode array in accordance with the second embodiment.
Figure 21:
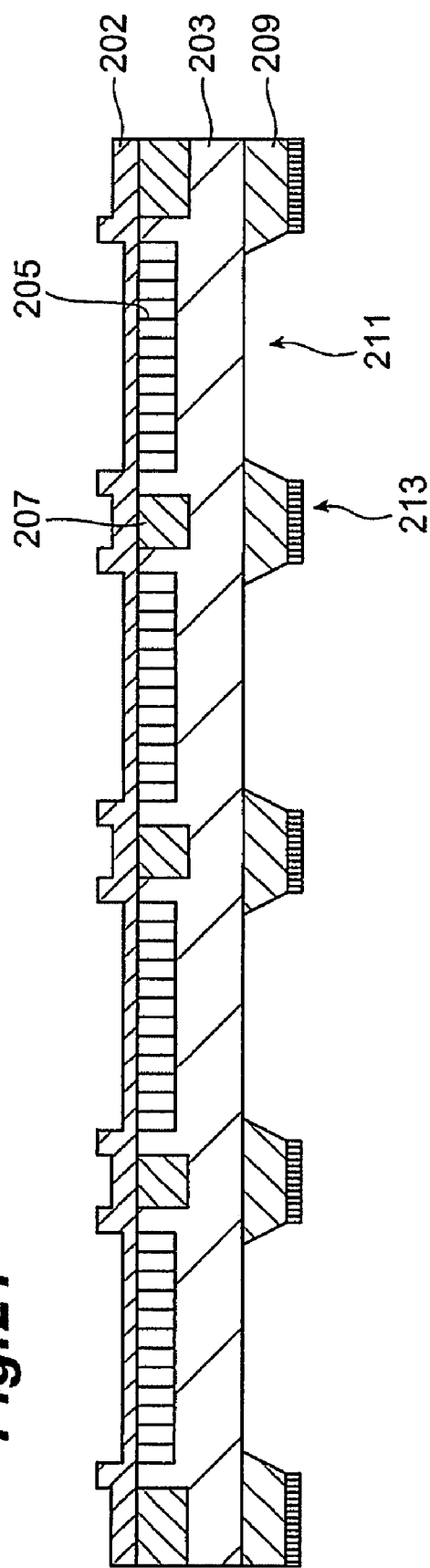
FIG. 21 is a view for explaining a step of making the photodiode array in accordance with the second embodiment.

FIG. 17 is a plan view of the photodiode array in accordance with a second embodiment, whereas FIG. 18 is a sectional view thereof taken along the line II—II.

In the following explanation, the surface formed with pn junctions 204 in the substrate will be referred to as the front side, whereas the light incident surface (on the depression side) will be referred to as backside.

In the photodiode array 201 of this embodiment, as shown in FIG. 17, a plurality of pn junctions are regularly arranged in a matrix, whereas each pn junction functions as a photosensitive pixel of a photodiode. The photodiode array 201 includes an n-type silicon substrate 203 having a thickness of 50 to 600 μm and an impurity concentration of $1 \times 10^{12}$ to $10^{15}/cm^3$, whereas a plurality of p-type impurity diffusion layers 205, each having a size of 500 μm×500 μm and an impurity concentration of $1 \times 10^{15}$ to $10^{20}/cm^3$, are arranged with a pitch of about 600 μm. The pn junctions formed between the n-type silicon substrate 203 and a plurality of p-type impurity diffusion layers 205 constitute the photosensitive pixels. Disposed between the p-type impurity diffusion layers 205 is an $n^+$-type impurity region (separation layer) 207 separating the photodiodes.

Disposed on the backside of the n-type silicon substrate 203 in regions not corresponding to the p-type impurity diffusion layers 205 is an $n^+$-type impurity diffusion layer 209 having a thickness on the order of 2 μm to 200 μm and an impurity concentration on the order of $1 \times 10^{15}$ to $10^{20}/cm^3$. Therefore, in the photodiode array of the present invention, the regions formed with the p-type impurity layers are thinned into a thickness on the order of 50 μm to 300 μm, for example, so as to form depressions 211, whereas the other regions are formed with projections (frames) 213 on the backside of thick parts having a thickness on the order of 150 μm to 500 μm. The thick parts are formed in the regions not formed with pn junctions, i.e., between the photodiodes, and are constituted by the $n^+$-type impurity diffusion layer 209 having a thickness on the order of 2 μm to 200 μm, and the n-type silicon substrate 203 having a thickness on the order of 50 μm to 300 μm. One depression 211 is provided for one pn junction (photosensitive pixel)

On the whole backside of the thinned n-type substrate (region corresponding to photodiodes), an $n^+$-type impurity diffusion layer 215 is formed with a thickness of 0.1 to several μm. The $n^+$-type impurity diffusion layer 215 has an accumulation function in which light (at a short wavelength in particular) incident on the backside thereof feeds signal carriers generated near the n-type silicon substrate surface into the substrate. On the front side of the substrate, a passivation film 223 made of SiN or $SiO_2$ or polyimide, or so on is formed.

On the front side of each p-type impurity diffusion layer 205, an aluminum wiring electrode 221 slightly larger than the p-type impurity diffusion layer 205 is placed so as to be in electrical contact with the p-type impurity diffusion layer 205. On the front side of the position corresponding to each projection 213, a solder bump electrode 219 is placed so as to penetrate through the passivation layer 223 by way of an under-bump metal (UBM) 217 made of Ni—Au and so on in contact with the aluminum wiring electrode 221. When implementing the photodiode array 201, electrical contact from the front side to the p-type impurity diffusion layer 205 can be achieved by way of the bump electrode 219, UBM 217, and aluminum wiring electrode 221.

A method of making the photodiode array in accordance with this embodiment will now be explained with reference to FIGS. 19 to 23. First, an n-type silicon substrate 203 having a crystal plane (100) with a thickness on the order of 50 μm to 600 μm is prepared. A uniform $n^+$ diffusion layer 209 having a thickness of 150 μm to 250 μm is formed by thermal diffusion on the backside of the substrate, so as to produce a substrate having a two-layer structure of n-type and $n^+$-type layers. Subsequently, the front side and backside of the substrate are subjected to thermal oxidation, so as to form an $SiO_2$ thermal oxidation film 202 (see FIG. 19). The $SiO_2$ thermal oxidation film 202 will be utilized as a mask for $n^+$ thermal diffusion in a later step.

Then, the $SiO_2$ thermal oxidation film 202 is perforated by a photo etching process at predetermined positions for forming a separation layer between adjacent photodiodes, and phosphorus is thermally doped and thermally oxidized, so as to form a separation layer 207.

Next, a p-type impurity diffusion layer 205 is diffused into a predetermined region on the front side of the n-type silicon substrate 203, so as to form a pn junction 204. First, the $SiO_2$ thermal oxidation film 202 is perforated by a photo etching process at positions to become photosensitive pixels, and boron is thermally doped and thermally oxidized. This forms a plurality of pn junctions 204 on the other side of the n-type substrate, which become parts corresponding to the photosensitive pixels. Namely, a photodiode array comprising photodiodes is formed (see FIG. 20).

When necessary, the backside is ground so as to adjust the substrate thickness. On the backside, a silicon nitride film (SiN) is formed by plasma CVD or LP-CVD, and then is etched away in parts corresponding to the photosensitive pixels. Subsequently, by alkali etching (using a sodium hydroxide solution, TMAH, or the like), the backside is subjected to anisotropic etching (see FIG. 21). Here, parts other than those corresponding to the photosensitive pixels are kept from thinning, thus leaving the $n^+$ diffusion layer 209, thereby constructing thick parts. This forms depressions 211 in the parts corresponding to the photosensitive pixels, whereas projections 213 are formed between adjacent photosensitive pixels. The etching is carried out to a depth of at least 2 μm, so as to reach the n layer 203 beyond the interface between the $n^+$ layer 209 and n layer 203 in the substrate. Then, the etching is done where the $n^+$ layer 209 may slightly remain, or where the n layer 203 may be exposed.

Figure 22:
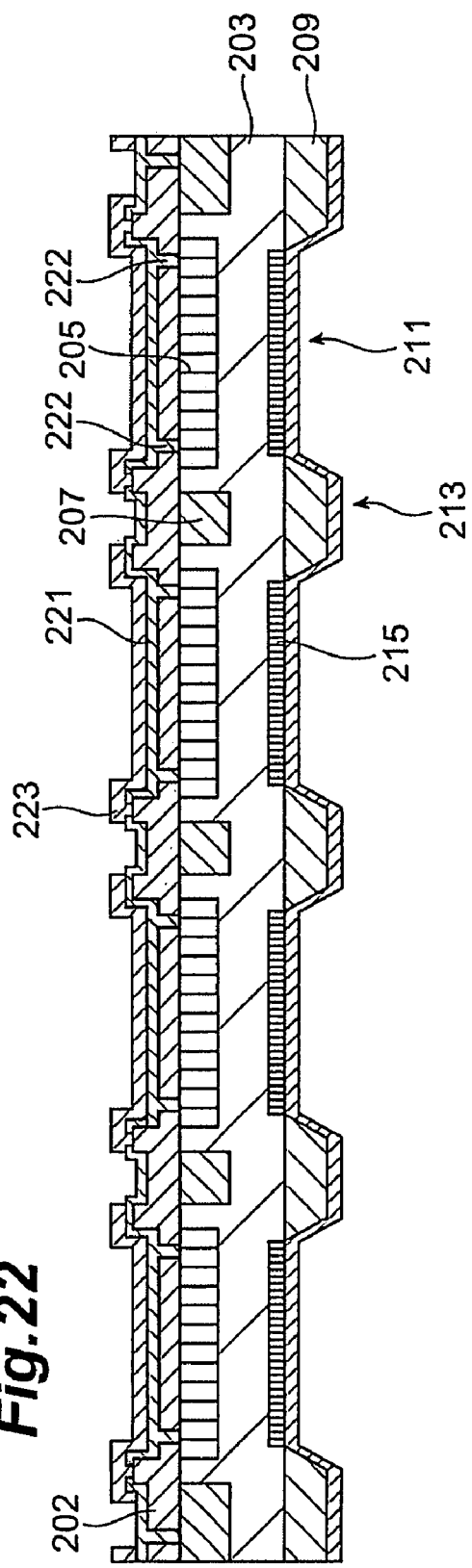
FIG. 22 is a view for explaining a step of making the photodiode array in accordance with the second embodiment.

After eliminating the etching mask (SiN), thermal oxidization (buffer oxidization) is carried out, and an n-type ion species (e.g., phosphorus or arsenic) is doped into the backside, so as to form an accumulation layer 215 having an impurity concentration of $10^{15}$ to $10^{20}/cm^3$ (see FIG. 22). Then, the thermal oxidization is done. The accumulation layer 215 has a thickness not reaching the $p^+$ layer 205 on the front side of the substrate. The backside is provided with an AR coat in order to attain a desirable spectral characteristic. However, the film thickness may be adjusted by repeating thermal oxidization or carrying out additional thermal oxidization, so as to yield an AR coat. An AR coat may also be formed by a composite film of a thermal oxidization film with SiN or an optical film or the like.

Thereafter, contact holes 222 for $p^+$ and $n^+$ layers are formed on the front side, and an aluminum wiring electrode 221 is formed (see FIG. 22). A passivation film 223 is deposited over the wafer, for covering the aluminum wiring electrode 221. Preferably, the aluminum wiring electrode 221 has a width slightly larger than the width of each of the $p^+$ and $n^+$ regions. This can improve the absolute maximum rating of reverse voltage at the time of bias application, and prevent inversion layers from being formed by surface damages. While parts for forming bump electrodes are perforated, a passivation film 223 is patterned on the aluminum wiring electrode (see FIG. 22). The passivation layer 223 may utilize SiN and $SiO_2$ formed by plasma CVD, BPSG, PSG, SiON, polyimide, acrylic, epoxy, urethane, and composite materials including them.

Figure 23:
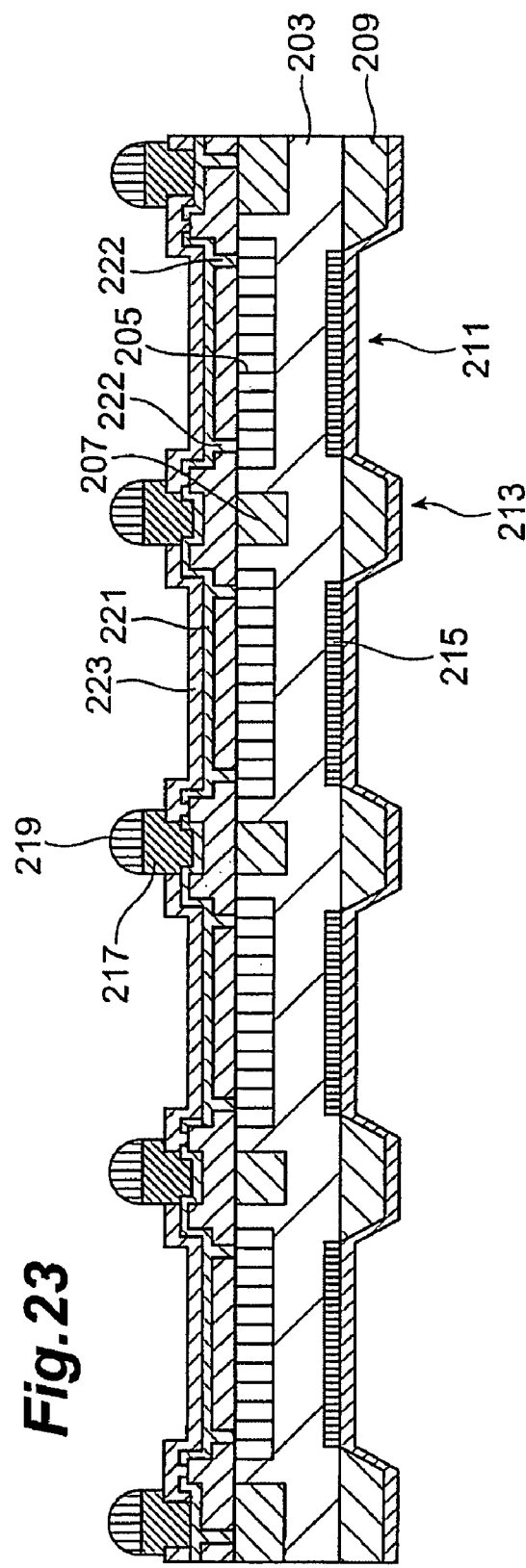
FIG. 23 is a view for explaining a step of making the photodiode array in accordance with the second embodiment.

When solder, which is poor in wettability with respect to aluminum, is used as a bump electrode, an intervening metal layer 217 (under-bump metal, UBM) for intervening between aluminum and a solder bump electrode 219 is formed, and the solder bump electrode 219 is superposed thereon (see FIG. 23). As the UBM, Ni—Au is formed by electroless plating. The UBM may also be realized by forming Ti—Pt—Au or Cr—Au by liftoff. Without being restricted to solder bumps, the bumps may be electrically conductive bumps including metals, such as gold bumps, nickel bumps, copper bumps, and electrically conductive resin bumps.

Here, since the $n^+$-type diffusion layer 209 constituting the projections 213 between photodiodes has an n-type impurity concentration higher than that in the n-type substrate, carriers are generated when light is incident on the $n^+$-type diffusion layer 209 in the projections 213. However, in the photodiode array, thus generated carriers are recombined by the $n^+$-type diffusion layer 209 in the projections 213 and disappear, thus failing to migrate to the n-type substrate 203. This can reduce the crosstalk between photodiodes generated by light incident on the gap between photodiode channels. At the same time, the gap between photosensitive pixels is made thicker, whereby the mechanical strength of the whole substrate can be maintained, which can restrain the substrate itself from being warped, distorted, and so forth. At the time of flip-chip bonding the photodiode array attracted to a collet onto a mount board, or mounting a scintillator to the projections 213 of the photodiode array, dark currents generated by mechanical damages can be restrained from increasing.

Thermal diffusion is used for forming the $n^+$ layers in the substrate. Therefore, unlike the case where the $n^+$ layers are formed by other methods (e.g., bonding of substrates), the impurity concentration becomes higher toward the backside of the substrate, whereby the projections 213 have a high impurity concentration. This enhances the effect of recombining/extinguishing carriers generated, thereby improving the effect of reducing dark currents, leak currents, and crosstalk.

Third Embodiment

The photodiode array in accordance with a third embodiment of the present invention will now be explained.

Figure 24:
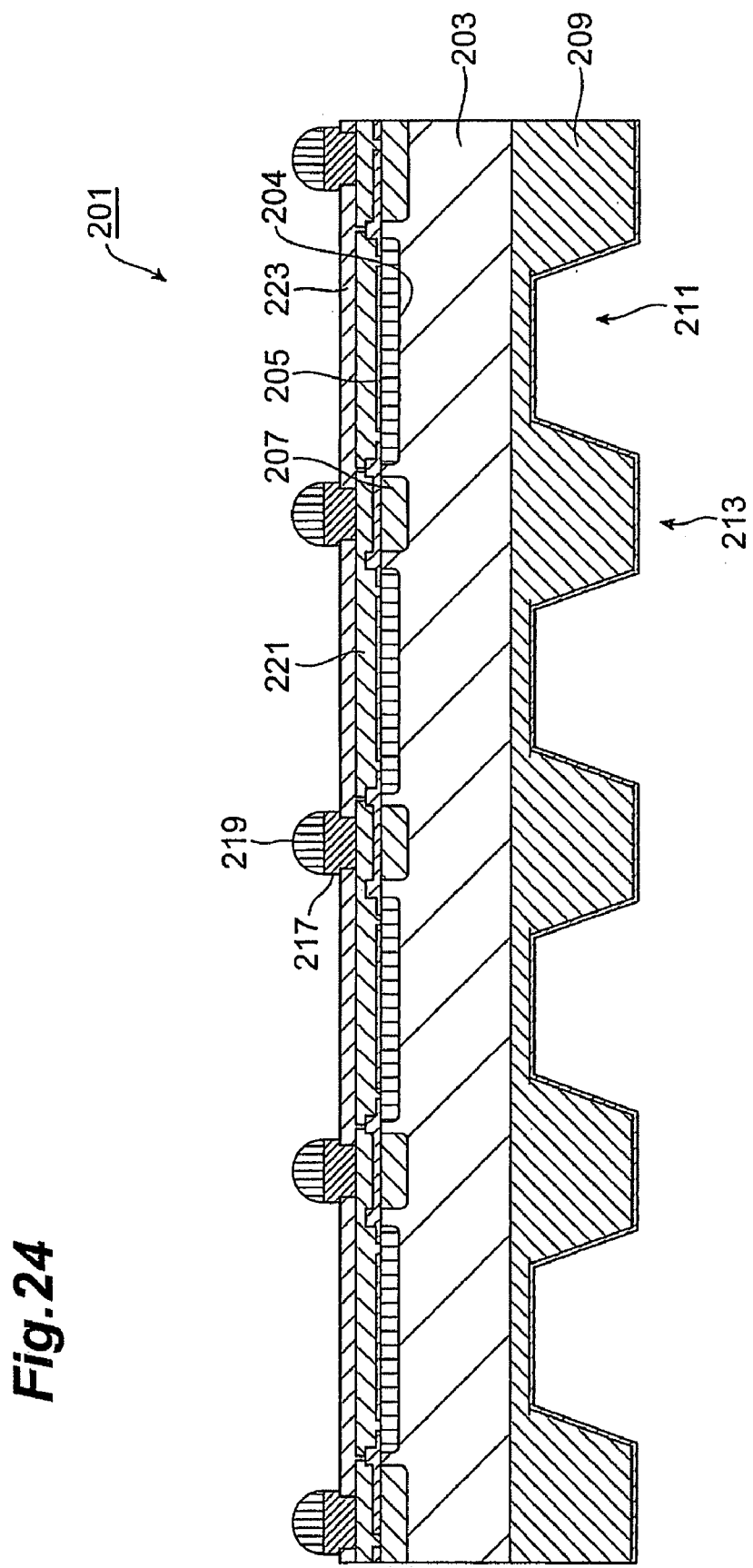
FIG. 24 is a side sectional view of the photodiode array in accordance with a third embodiment.

FIG. 24 is a side sectional view of the photodiode array in accordance with this embodiment. In terms of configurational difference from the photodiode array in accordance with the second embodiment, while the $n^+$-type accumulation layer 215 is formed within the n-type substrate 203 in the photodiode array in accordance with the second embodiment, the $n^+$-type impurity diffusion layer 209 is left by several μm in the photodiode array in accordance with the third embodiment so as to function as an accumulation layer (see FIG. 24). The function of the accumulation layer does not differ from that explained in the second embodiment.

The difference mentioned above results from the difference between respective methods of making the photodiode arrays. While the etching for forming depressions in parts corresponding to the photosensitive pixels is carried out until it reaches the n layer 203 in the first embodiment, the etching is stopped at a position about 0.1 to several μm short of the interface between the $n^+$ and n layers in the third embodiment.

In this photodiode array, the $n^+$-type impurity diffusion layer left unetched having a thickness of several μm also acts as an accumulation layer as it is, which makes it unnecessary to newly form an accumulation layer by ion implantation, whereby a step can be saved. Except for these points, the configuration and making method are totally the same as those of the photodiode array in accordance with the first embodiment.

Though the $n$-$n^+$ substrate is formed by producing the $n^+$ diffusion layer 209 by thermal diffusion on the backside of the n-type silicon substrate 203 in the photodiodes in accordance with the second and third embodiments, the following modifications may be considered as a step of preparing an $n$-$n^+$ substrate.

The $n$-$n^+$ substrate may be formed by preparing an $n^+$-type substrate, and epitaxially growing an n layer on the front side thereof with a crystal plane (100) or (110). The $n$-$n^+$ substrate may also be formed, on the contrary, by preparing an n-type substrate, and epitaxially growing an $n^+$ layer on the front side thereof with a crystal plane (100) or (110). Such techniques are advantageous in that the profile distribution of the impurity density becomes stair-like, and flat etching is possible when forming depressions.

Since the $n^+$ substrate or $n^+$ epitaxially grown layer doped with a high concentration of an impurity can attain a uniform concentration in the depth direction, carriers generated by light from short to long wavelengths incident on the projections can be recombined, which is advantageous in reducing crosstalk.

Assuming that the impurity of the first conductivity type is p type, and a semiconductor layer having an impurity concentration of $1\times10^{17}/cm^3$ or less is formed by crystal growth, performing alkali etching until the semiconductor interface is exposed and then carrying out etching with a mixed solution using hydrofluoric acid, nitric acid, and acetic acid stops etching at the interface, whereby flat depressions can be formed.

The $n$-$n^+$ substrate may also be formed by preparing an n-type substrate with a crystal plane (100) or (110), and bonding an $n^+$-type substrate onto the backside thereof so that their crystal planes align with each other. This can form a stepped impurity concentration profile in the n and $n^+$ layers, which is advantageous in that flat etching is possible when forming depressions.

Also, the $n^+$ substrate doped with a high concentration of an impurity can attain a uniform concentration in the depth direction, whereby carriers generated by light from short to long wavelengths incident on the projections can be recombined, which is advantageous in reducing crosstalk.

Assuming that the impurity of the first conductivity type is p type, and a semiconductor layer having an impurity concentration of $1\times10^{17}/cm^3$ or less is formed by bonding, performing alkali etching until the semiconductor interface is exposed and then carrying out etching with a mixed solution using hydrofluoric acid, nitric acid, and acetic acid stops etching at the interface, whereby flat depressions can be formed.

The $n$-$n^+$ substrate may also be formed by preparing an n-type substrate with a crystal plane (111), and bonding an $n^+$-type substrate with a crystal plane (100) or (110) onto the backside thereof. Since the (111) plane exhibits an etching rate much slower than that in the (100) or (110) plane, alkali etching from the $n^+$ layer can be stopped at a point almost reaching the n layer, which is advantageous in that it becomes easier to control the etching.

Fourth Embodiment

The photodiode array in accordance with a fourth embodiment of the present invention will now be explained.

Figure 25:
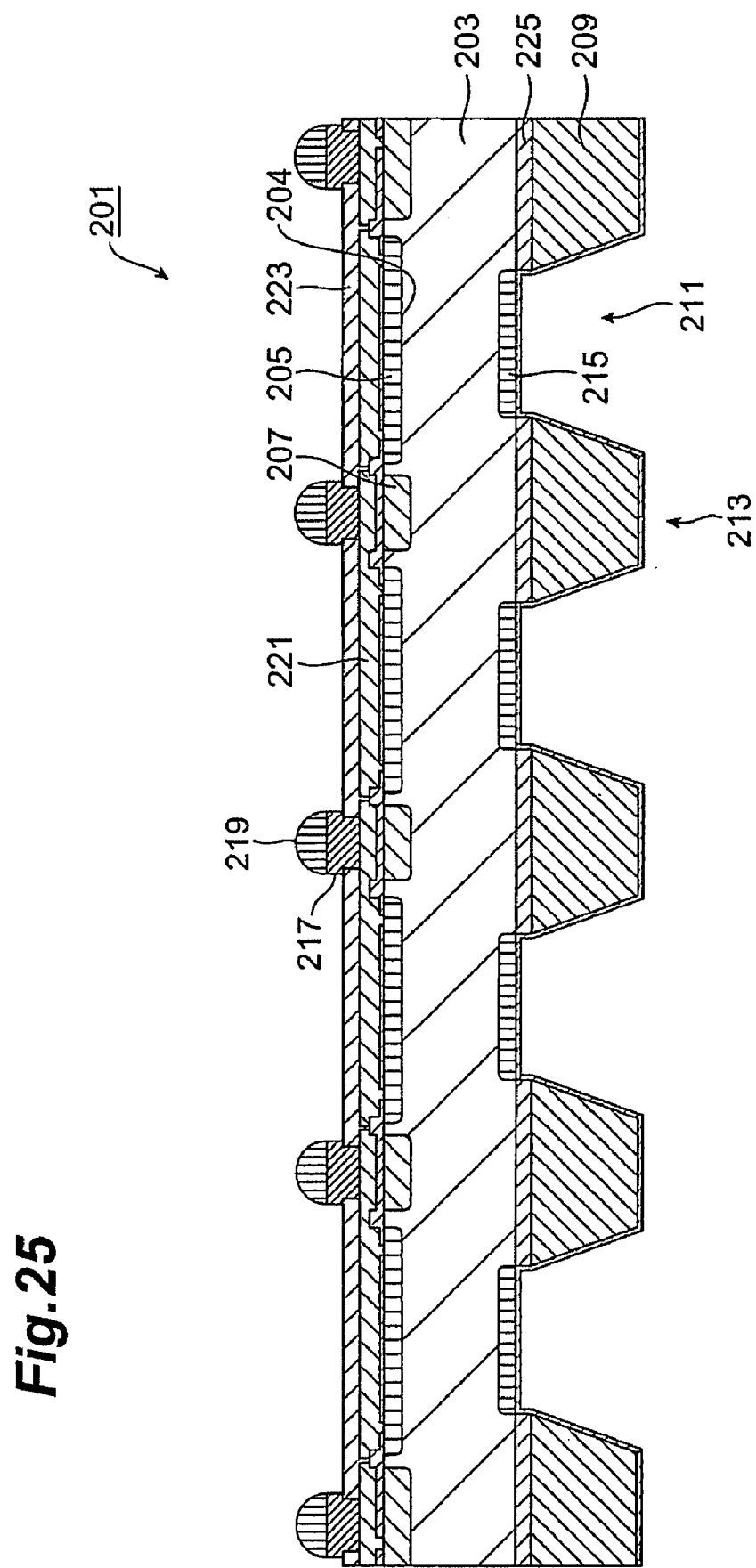
FIG. 25 is a side sectional view of the photodiode array in accordance with a fourth embodiment.

FIG. 25 is a sectional view of the photodiode array in accordance with this embodiment. In terms of the configurational difference from the photodiode array in accordance with the third embodiment, while the n$^+$ and n layers are directly in contact with each other in the photodiode array in accordance with the third embodiment, an SiO$_2$ layer 225 having a thickness of 0.1 to 3 µm is held between the n$^+$ and n layers in the fourth embodiment.

Figure 27:
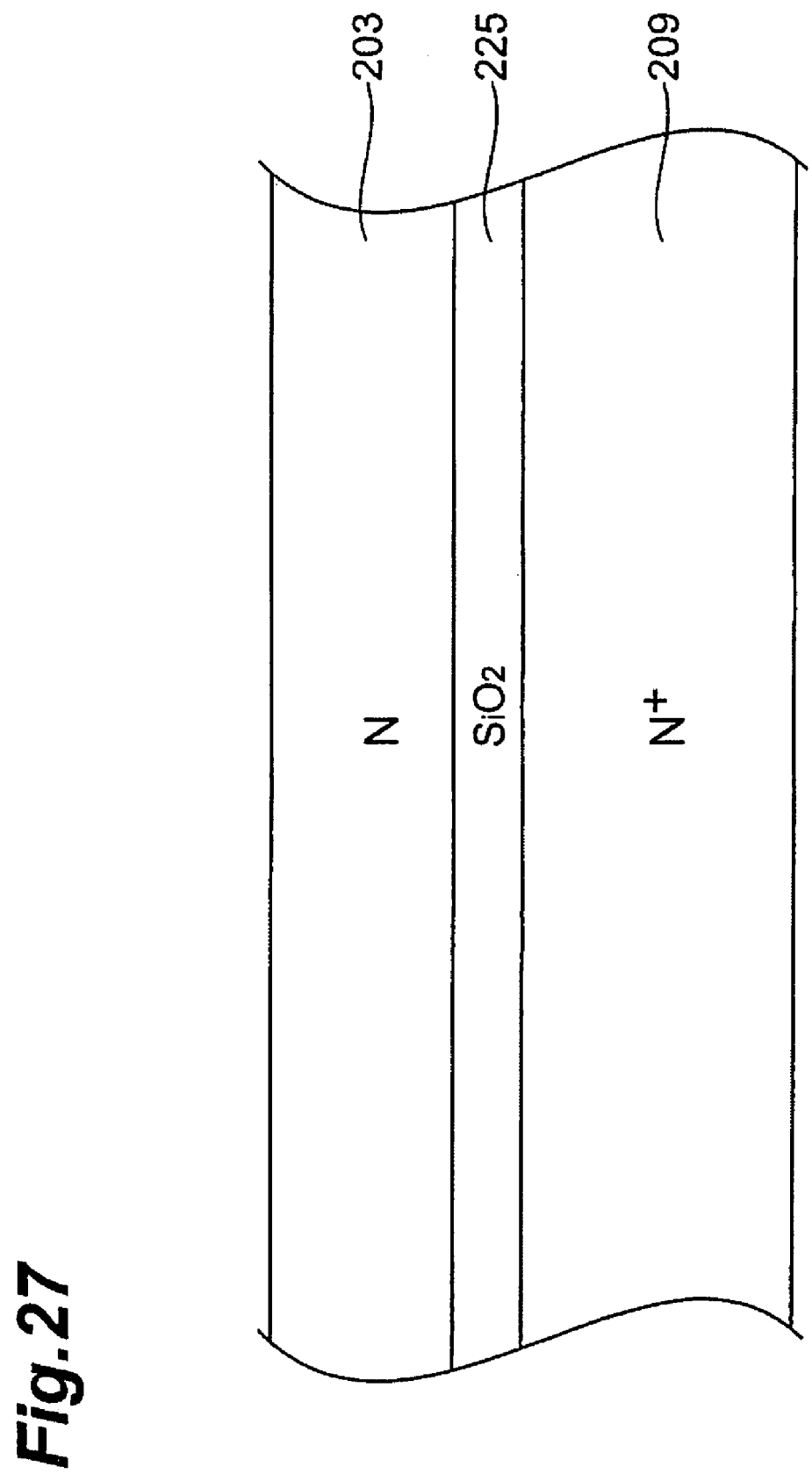
FIG. 27 is a side sectional view of the semiconductor substrate in accordance with an embodiment.

The difference mentioned above results from the difference in respective methods of making the photodiode arrays. Though an n-type silicon substrate is prepared and an n$^+$ diffusion layer is formed by thermal diffusion on the backside of the substrate so as to produce an n-n$^+$ diffusion substrate, which is used as a substrate in the third embodiment, an SOI (Silicon On Insulator) substrate is used as the substrate in the fourth embodiment. Namely, an n-type silicon substrate is prepared at first, and the backside thereof is thermally oxidized so as to form an SiO$_2$ oxidization film. Subsequently, an n$^+$ layer with a crystal plane (100) or (110) is bonded to the backside thereof, so as to form an SOI substrate having a three-layer structure as shown in FIG. 27, which is used as the substrate.

Since the etching is stopped at the SiO$_2$ layer 225 in the alkali etching step in this photodiode array, it becomes easier to control the etching. Even if carriers are generated in the n$^+$ layer, they do not pass the SiO$_2$ layer 225 that is an insulating layer. Therefore, thus generated carriers fail to reach the individual photosensitive pixels, whereby the crosstalk can further be reduced. Except for these points, the configuration and making method are totally the same as those of the photodiode array in accordance with the third embodiment.

Fifth Embodiment

The photodiode array in accordance with a fifth embodiment of the present invention will now be explained.

Figure 26:
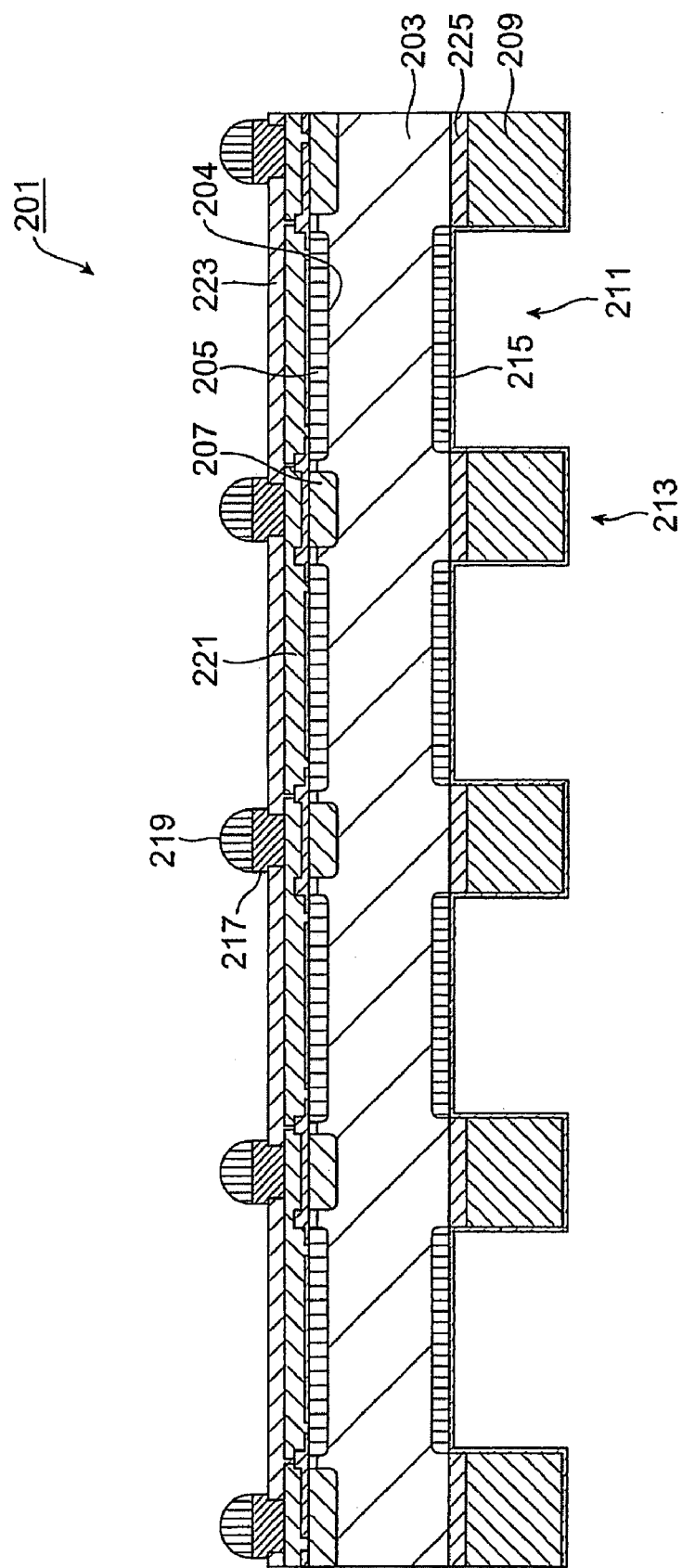
FIG. 26 is a side sectional view of the photodiode array in accordance with a fifth embodiment.

FIG. 26 is a sectional view of the photodiode array in accordance with this embodiment. In terms of the configurational difference from the photodiode array in accordance with the fourth embodiment, while side faces of depressions in the photodiode array of the fourth embodiment are inclined with respect to the thickness direction of the substrate such that the depressions 211 in parts corresponding to photodiodes become wider toward the backside and narrower toward the front side, side faces of depressions in the photodiode array of the fifth embodiment are substantially parallel to the thickness direction of the substrate.

The difference mentioned above results from the difference in respective methods of making the photodiode arrays. Though alkali etching is used for forming the depressions 211 in the fourth embodiment, the fifth embodiment employs deep dry etching using high-density plasma, for example.

Since this photodiode array employs deep dry etching as a method of forming depressions, the n$^+$ layer in the SOI substrate to be prepared is not required to limit its crystal plane to (100) or (110). Also, the etching stops at the SiO$_2$ layer 225 and thus is easier to control. Except for these points, the configuration and making method are totally the same as those of the photodiode array in accordance with the fourth embodiment.

An embodiment of the radiation detector in accordance with the present invention will now be explained.

Figure 28:
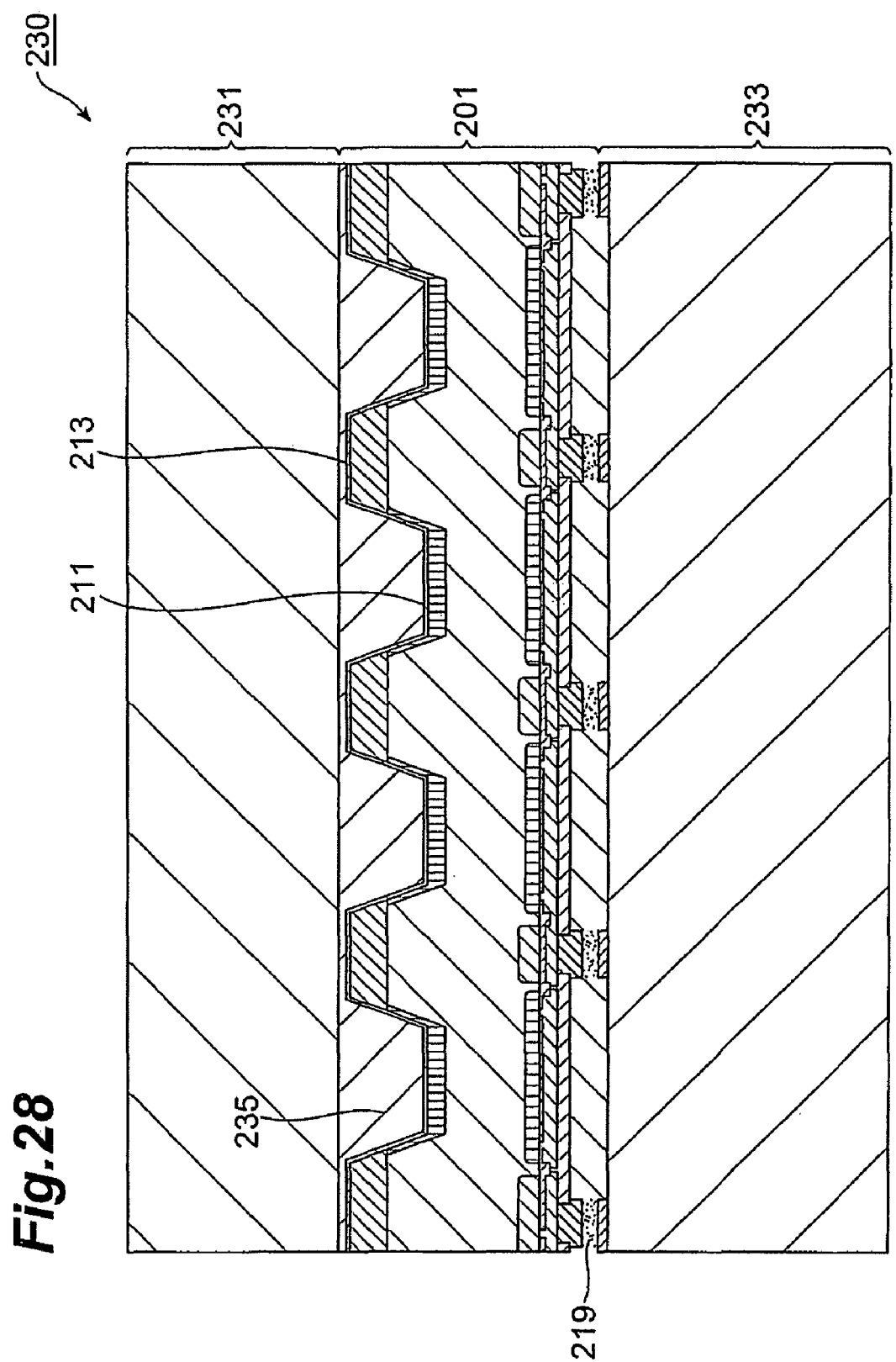
FIG. 28 is a side sectional view of the radiation detector in accordance with an embodiment.

FIG. 28 is a side sectional view of the radiation detector in accordance with this embodiment. This radiation detector 230 comprises a scintillator panel 231 for receiving radiation and emitting light generated by the radiation from the opposite surface from the incident surface; a photodiode array 201 for receiving the light emitted from the scintillator panel 231 and converting thus received light into an electric signal; and an implemented wiring board 233.

This radiation detector comprises a photodiode array in accordance with the present invention. In this embodiment, the radiation detector comprises the photodiode array in accordance with the second embodiment of the present invention. Therefore, the scintillator panel 231 is disposed on the backside of the photodiode array 201 and is in contact with the photodiode array 201 at the projections 213. As a consequence, a gap exists between the scintillator panel 231 and the depressions 211. This gap is filled with a coupling resin 235 having the effective refractive index, with which the luminescence from the scintillator panel 231 propagates through, whereby the light emitted from the scintillator panel 231 can efficiently be made incident on the photodiode array 201.

The implemented wiring board 233 is disposed on the front side of the photodiode array 201 and is electrically in contact with the photodiode array 201 by way of the bump electrodes 219. The mode of implementation is flip-chip mounting, whereas the bump electrodes 219 use electrically conductive bumps including metals, such as solder bumps, gold bumps, nickel bumps, copper bumps, and electrically conductive resin bumps, and the like. Employable as bonding modes are those of direct bonding, underfill filling, anisotropic conductive film (ACF), anisotropic conductive paste (ACP), nonconductive paste (NCP), and the like.

Effects of the radiation detector will now be explained. When bonding the photodiode array 201 onto the implemented wiring board 233, the projections 213 are attracted to vacuum collets. At this time, the projections may be mechanically damaged, and the resulting defects may generate carriers to become dark currents and noise. When placing the scintillator panel 231 on the backside of the photodiode array 201, the scintillator panel 231 is brought into contact with the projections 213. At this time, the projections 213 may also be mechanically damaged, whereby carriers may be generated. Since the radiation detector uses the photodiode array in accordance with the present invention, the projections 213 are constituted by an n$^+$-type diffusion layer having a high impurity concentration, whereby the generated carriers can be recombined, so as to reduce such dark currents and noise.

Since each projection 213 is disposed between photosensitive pixels of the photodiode array 201, the incident light can be separated into individual pixels in the radiation detector. Further, since the projection 213 is constituted by the n$^+$-type diffusion layer having a high impurity concentration, the light incident on the gap between photosensitive pixels is restrained from being taken out as a signal. Namely, the radiation detector can suppress the crosstalk between photosensitive pixels.

If a photodiode array with no projections/depressions on the backside is used in the radiation detector, vacuum collets directly come into contact with photosensitive pixels when bonding the photodiode array onto the implemented wiring board 233. When mounting a scintillator panel, it directly comes into contact with photosensitive pixels in a similar manner, which may damage the photosensitive pixels, thus being likely to cause pixel defects. In the radiation detector, since the photosensitive pixel parts are arranged in the depressions 211, the photosensitive pixels have no contact during the implementation step, and thus are less susceptible to mechanical damages, whereby photosensitive pixel defects can be prevented from occurring.

Without being restricted to the above-mentioned embodiments, the present invention can be modified in various manners.

Figure 29A:
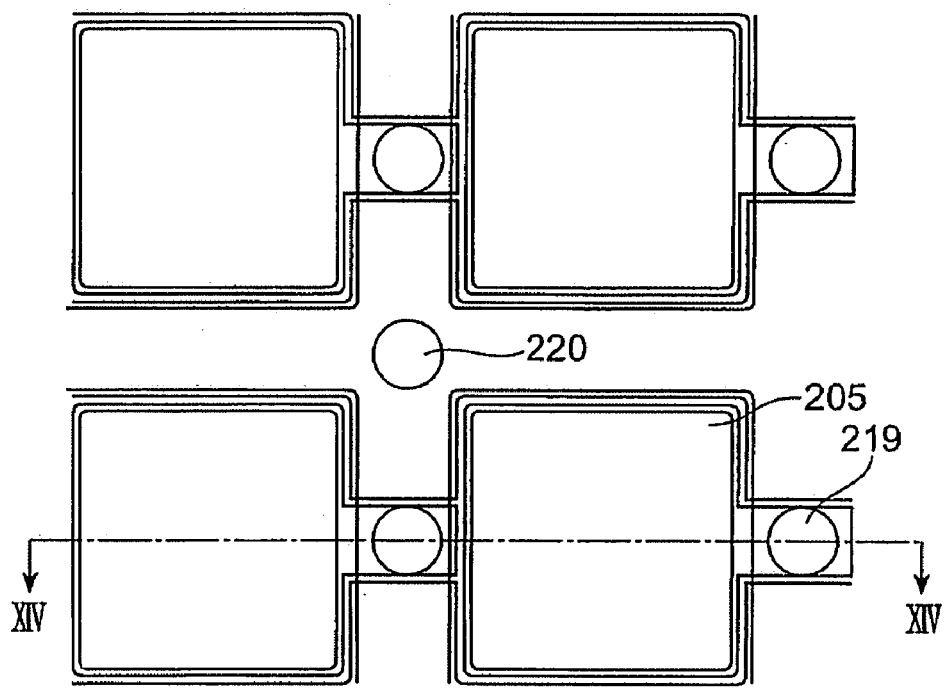
FIG. 29A is a top plan view showing the positional relationship between photosensitive pixel parts and bump electrodes in a photodiode array.
Figure 29B:
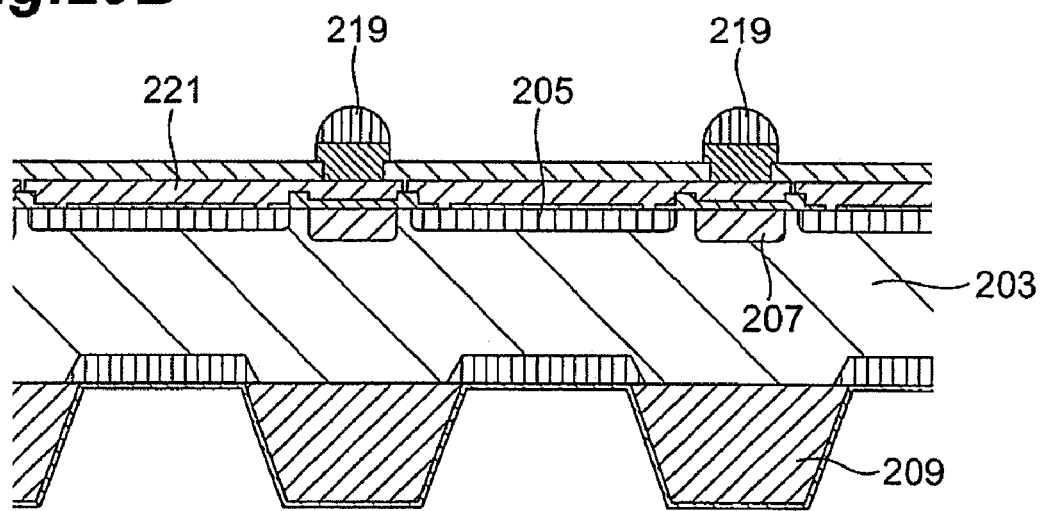
FIG. 29B is a sectional view of the photodiode array taken along the line XIV—XIV of FIG. 29A.
Figure 30A:
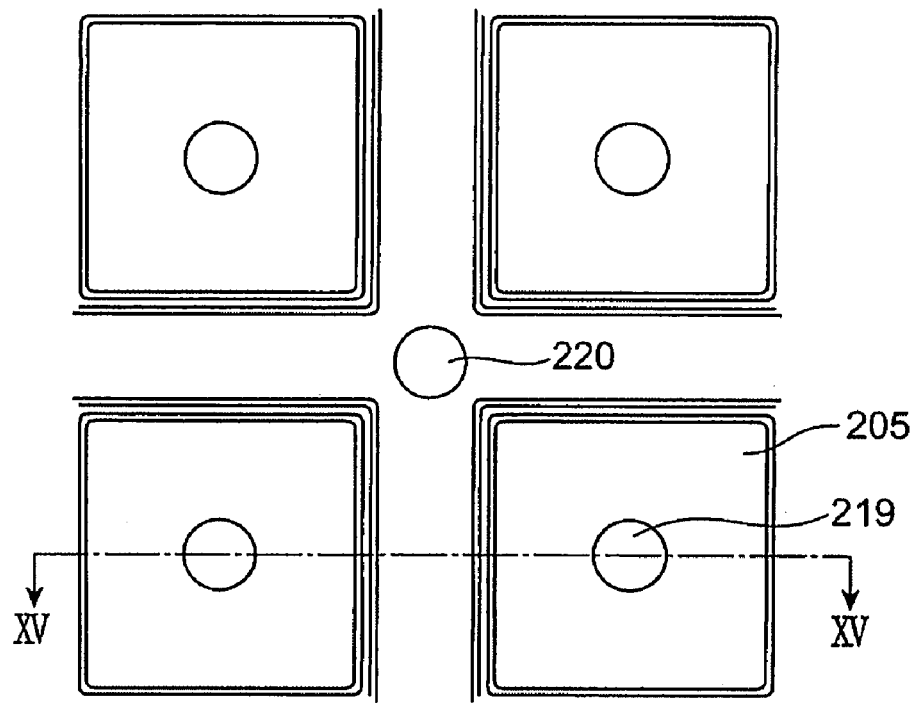
FIG. 30A is a top plan view showing the positional relationship between photosensitive pixel parts and bump electrodes in a photodiode array.
Figure 30B:
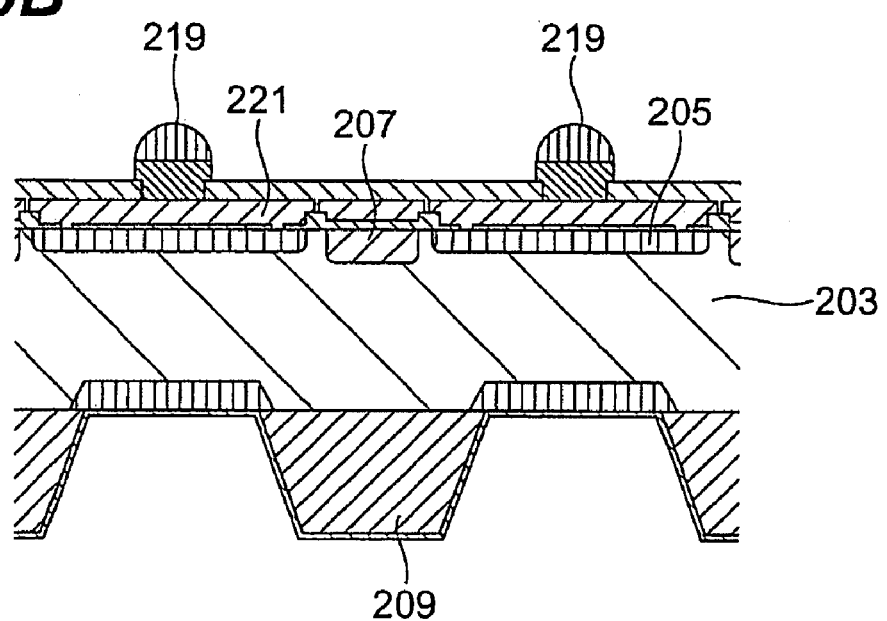
FIG. 30B is a sectional view of the photodiode array taken along the line XV—XV of FIG. 30A.
Figure 31A:
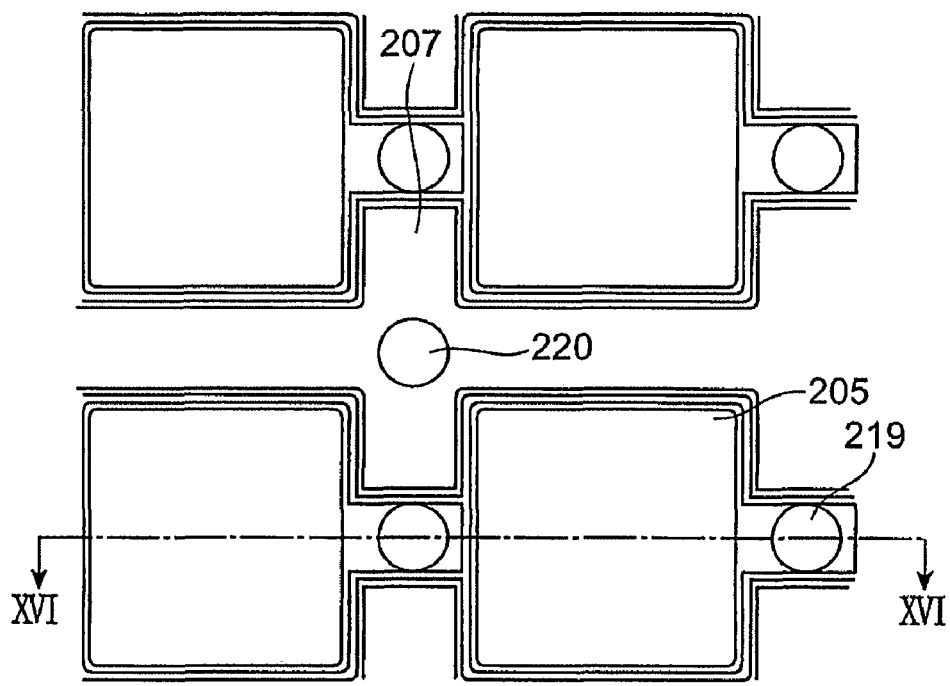
FIG. 31A is a top plan view showing the positional relationship between photosensitive pixel parts and bump electrodes in a photodiode array.

FIG. 29A is a top plan view showing the positional relationship between photosensitive pixel parts and bump electrodes in a photodiode array, whereas FIG. 29B is a sectional view of the photodiode array taken along the line XIV—XIV of FIG. 29A. FIG. 30A is a top plan view showing the positional relationship between photosensitive pixel parts and bump electrodes in a photodiode array, whereas FIG. 30B is a sectional view of the photodiode array taken along the line XV—XV of FIG. 30A. FIG. 31A is a top plan view showing the positional relationship between photosensitive pixel parts and bump electrodes in a photodiode array, whereas FIG. 31B is a sectional view of the photodiode array taken along the line XVI—XVI of FIG. 31A.

For example, while the bump electrodes 219 are placed in thick parts, i.e., parts corresponding to the projections 213, in each of the above-mentioned embodiments of the photodiode array as shown in FIGS. 29A and 29B, so as to secure a mechanical strength at the time of implementation, the bump electrodes 219 may be placed at positions corresponding to photosensitive pixels as shown in FIGS. 30A and 30B if the mechanical strength can be secured sufficiently.

Figure 31B:
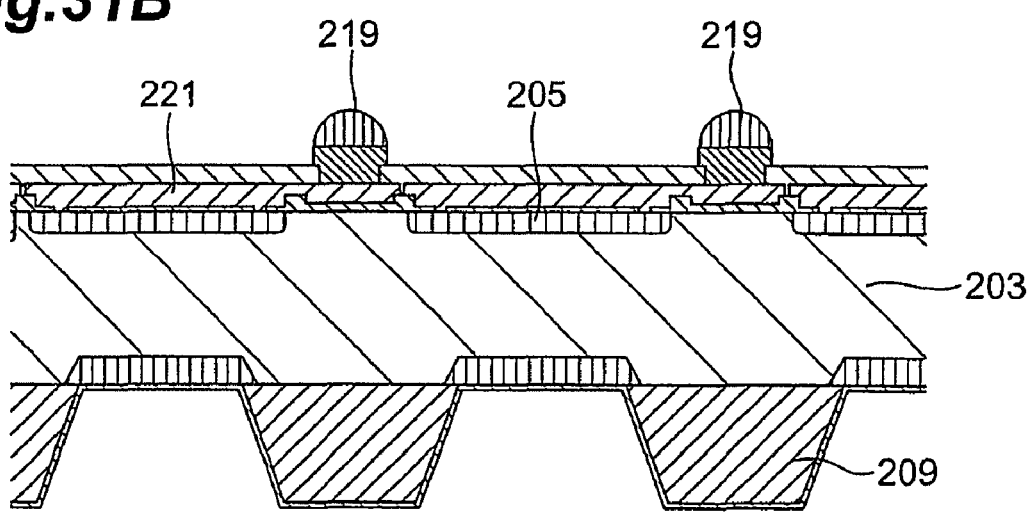
FIG. 31B is a sectional view of the photodiode array taken along the line XVI—XVI of FIG. 31A.

When placing the bump electrodes in parts corresponding to the projections 213, the separation layer 207 may be broken in only parts corresponding to the backside of the bump electrodes 219 as shown in FIGS. 31A and 31B. This can keep the anode and cathode from short-circuiting even when mechanical damages occur at the time of flip-chip mounting. Also, in this case, broken separation layers may be connected to each other by an aluminum electrode wire, so that the separation layers 207 are connected together in the whole region.

Figure 32A:
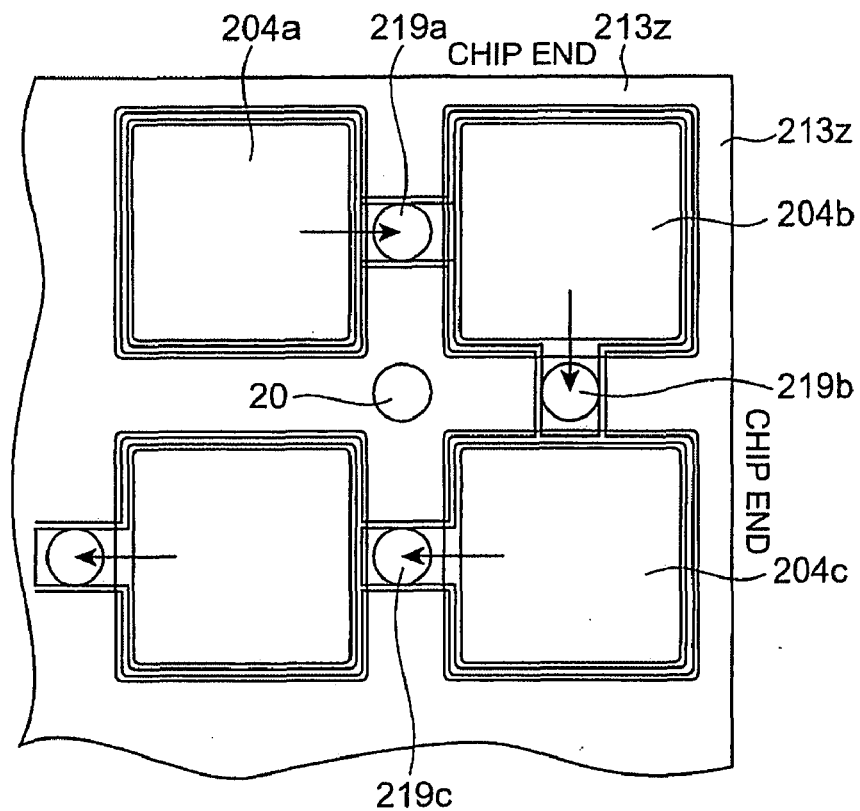
FIG. 32A is an enlarged view of chip end parts of the photodiode array shown in FIG. 32B.
Figure 32B:
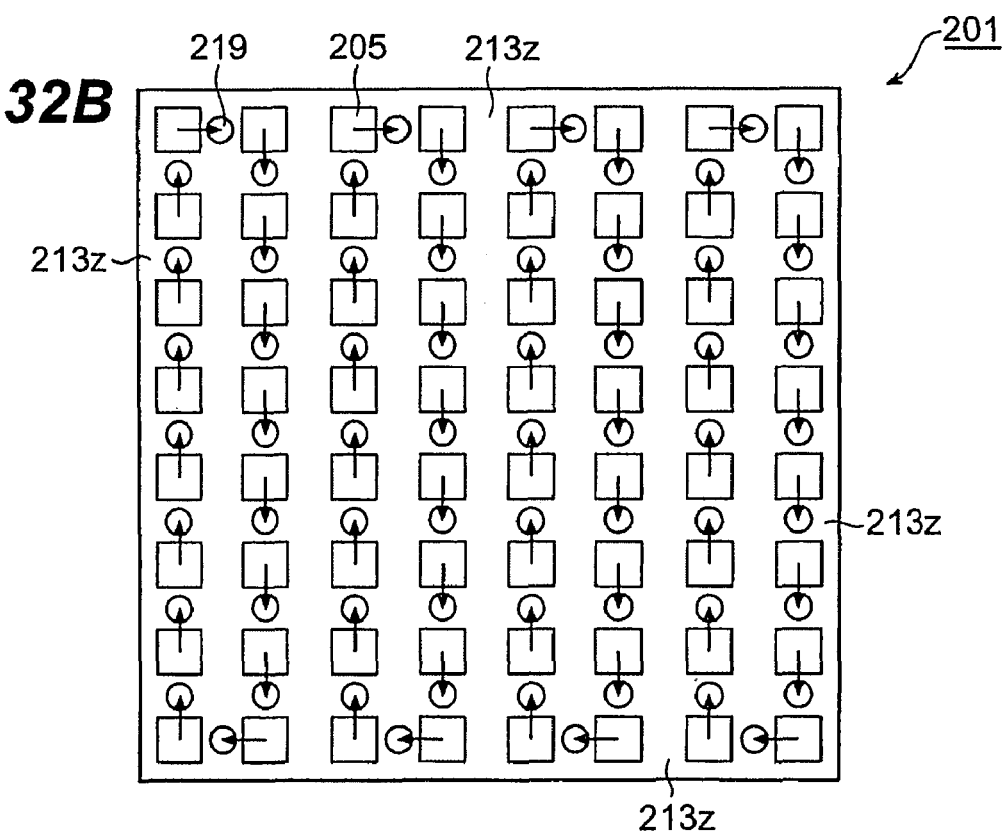
FIG. 32B is a top plan view showing the positional relationship between photosensitive pixel parts and bump electrodes in the photodiode array at chip ends in accordance with an embodiment.

Preferably, when placing photosensitive devices in a matrix, the photosensitive pixel area extends nearly to photodiode array chip ends. Therefore, it will be preferable if bump electrodes keep away from the thick regions 213z at chip ends as shown in FIG. 17. Hence, when placing the bump electrodes 219 in thick parts, all the bump electrodes 219 may be disposed in the projections other than the thick regions 213z at chip ends as shown in FIG. 32A. FIG. 32B is a top plan view showing the positional relationship between photosensitive pixel parts and bump electrodes at photodiode array chip ends. For example, in FIG. 32A, the photosensitive pixel 204a on the upper left side makes contact with the bump electrode 219a on the right side thereof, the photosensitive pixel 204b on the upper right side makes contact with the bump electrode 219b on the lower side thereof, and the photosensitive pixel 204c on the lower right side makes contact with the bump electrode 219c on the left side thereof. Designing the positions of bump electrodes 219 so as to make them keep away from the thick regions 213z at chip ends as such can expand the photosensitive pixel area nearly to the photodiode array chip ends.

As explained in detail in the foregoing, the present invention can provide a photodiode array which can keep the mechanical strength of the photodiode array and reduce the crosstalk between devices.

What is claimed is:

1. A photodiode array comprising a semiconductor substrate having a plurality of incident-side depressions on a light incident surface side and a plurality of opposite-side depressions on the side opposite from the light incident side; the opposite-side depressions corresponding to the incident-side depressions, respectively, and having a bottom provided with a pn junction, wherein the pn junction extends from the bottom of the opposite-side depressions to an opposite-side frame surrounding the opposite-side depressions.

2. A photodiode array comprising a semiconductor substrate having a plurality of incident-side depressions on a light incident surface side and a plurality of opposite-side depressions on the side opposite from the light incident side; the opposite-side depressions corresponding to the incident-side depressions, respectively, and having a bottom provided with a pn junction, wherein a bottom of the incident-side depressions has an area greater than that of the bottom of the opposite-side depressions.

3. A photodiode array comprising a semiconductor substrate having a plurality of incident-side depressions on a light incident surface side and a plurality of opposite-side depressions on the side opposite from the light incident side; the opposite-side depressions corresponding to the incident-side depressions, respectively, and having a bottom provided with a pn junction, wherein an incident-side frame surrounding the incident-side depressions is formed with a high impurity concentration region.

4. A photodiode array comprising:

a semiconductor substrate having a plurality of incident-side depressions on a light incident surface side and a plurality of opposite-side depressions on the side opposite from the light incident side; the opposite-side depressions corresponding to the incident-side depressions, respectively, and having a bottom provided with a pn junction; and an electrode pad, disposed on an opposite-side frame surrounding the opposite-side depressions, for taking out an output of a photodiode comprising the pn junction.

5. A photodiode array according to claim 4, further comprising a wiring electrode, passing a side face part of the opposite-side depressions, for electrically connecting the photodiode and the electrode pad to each other.

6. A radiation detector comprising the photodiode array in accordance with one of claims 1, 2, 3, 4, and 5, and a scintillator disposed in front of an incident surface of light to be detected in the photodiode array.

7. A photodiode array comprising:

a semiconductor substrate doped with a high concentration of an impurity having a first conductivity type;

a semiconductor layer of the first conductivity type disposed in contact with a side opposite from an incident surface of the semiconductor substrate for light to be detected;

a plurality of photosensitive layers having a second conductivity type arranged in an array within the semiconductor layer having the first conductivity type;

the semiconductor substrate being formed like a lattice by eliminating regions corresponding to the photosensitive layers; and an etching stop layer disposed between the semiconductor substrate and the semiconductor layer.

8. A photodiode array comprising:

a semiconductor substrate doped with a high concentration of an impurity having a first conductivity type;

a semiconductor layer of the first conductivity type disposed in contact with a side opposite from an incident surface of the semiconductor substrate for light to be detected;

a plurality of photosensitive layers having a second conductivity type arranged in an array within the semiconductor layer having the first conductivity type;

the semiconductor substrate being formed like a lattice by eliminating regions corresponding to the photosensitive layers; and an insulating layer disposed between the semiconductor substrate and the semiconductor layer.

9. A radiation detector comprising:

the photodiode array according to one of claims 7 to 8; and a scintillator panel, attached to the photodiode array on an incident surface side of the light to be detected, emitting light when radiation is incident thereon.

* * * * *